US011600658B2

(12) United States Patent
Finck et al.

(10) Patent No.: US 11,600,658 B2
(45) Date of Patent: Mar. 7, 2023

(54) QUANTUM COUPLER FACILITATING SUPPRESSION OF ZZ INTERACTIONS BETWEEN QUBITS

(71) Applicant: International Business Machines Corporation, Armonk, NY (US)

(72) Inventors: Aaron Finck, White Plains, NY (US); John Blair, Katonah, NY (US); April Carniol, Ossining, NY (US); Oliver Dial, Yorktown Heights, NY (US); Muir Kumph, Croton on Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 189 days.

(21) Appl. No.: 16/917,016

(22) Filed: Jun. 30, 2020

(65) Prior Publication Data

US 2021/0408112 A1 Dec. 30, 2021

(51) Int. Cl.
*H01L 39/02* (2006.01)
*H01L 27/18* (2006.01)
(Continued)

(52) U.S. Cl.
CPC ............. *H01L 27/18* (2013.01); *G06N 10/00* (2019.01); *H01L 39/025* (2013.01); *H01L 39/223* (2013.01)

(58) Field of Classification Search
CPC ..... H01L 27/18; H01L 39/025; H01L 39/223; H01L 39/00–2496; G06N 10/00;
(Continued)

(56) References Cited

U.S. PATENT DOCUMENTS 9,059,674 B2 6/2015 Chow et al.
9,892,365 B2 * 2/2018 Rigetti .................. G06N 10/00
(Continued)

FOREIGN PATENT DOCUMENTS

CN 108038549 5/2018
CN 108090569 5/2018
(Continued)

OTHER PUBLICATIONS

Gambetta et al., "A superconducting qubit with Purcell protection and tunable coupling," Phys Rev Lett 106, 030502, arXiv:1009.4470v1 [cond-mat.mes-hall], Oct. 22, 2018, 4 pages.
(Continued)

*Primary Examiner* — Shahed Ahmed
(74) *Attorney, Agent, or Firm* — Amin, Turocy & Watson, LLP

(57) ABSTRACT

Devices and/or computer-implemented methods to facilitate ZZ cancellation between qubits are provided. According to an embodiment, a device can comprise a coupler device that operates in a first oscillating mode and a second oscillating mode. The device can further comprise a first superconducting qubit coupled to the coupler device based on a first oscillating mode structure corresponding to the first oscillating mode and based on a second oscillating mode structure corresponding to the second oscillating mode. The device can further comprise a second superconducting qubit coupled to the coupler device based on the first oscillating mode structure and the second oscillating mode structure.

10 Claims, 11 Drawing Sheets

(51) Int. Cl.
*G06N 10/00* (2022.01)
*H01L 39/22* (2006.01)

(58) Field of Classification Search
CPC ........ G06N 10/40; G06N 10/70; G06N 10/20; H03K 19/017545; H03K 19/195
See application file for complete search history.

(56) References Cited

U.S. PATENT DOCUMENTS

| | | | |
|---|---|---|---|
| 9,893,262 | B2 | 2/2018 | Thompson et al. |
| 10,068,181 | B1 | 9/2018 | Rigetti et al. |
| 10,074,792 | B1* | 9/2018 | Ferguson ............... G06N 10/00 |
| 10,177,297 | B2 | 1/2019 | Marcus et al. |
| 10,352,992 | B1 | 7/2019 | Zeng et al. |
| 10,353,844 | B2 | 7/2019 | Naaman et al. |
| 10,354,198 | B1 | 7/2019 | Filipp et al. |
| 10,468,740 | B2 | 11/2019 | Minev et al. |
| 10,622,998 | B1* | 4/2020 | Najafi-Yazdi ......... H01L 39/025 |
| 2017/0193388 | A1* | 7/2017 | Filipp .................... G06F 15/82 |
| 2018/0240034 | A1* | 8/2018 | Harris .................... G06N 10/20 |
| 2018/0260729 | A1 | 9/2018 | Abdo et al. |
| 2019/0005403 | A1 | 1/2019 | Blais et al. |

FOREIGN PATENT DOCUMENTS

| | | |
|---|---|---|
| CN | 108805293 | 11/2018 |
| CN | 109389223 | 2/2019 |

OTHER PUBLICATIONS

Srinivasan et al., "Tunable coupling in circuit quantum electrodynamics with a superconducting V-system," Phys Rev Lett 106, 083601, arXiv:1011.4317v1 [cond-mat.supr-con], Nov. 18, 2010, 5 pages.
Rebic et al., "Giant-Kerr nonlinearities in Circuit-QED," Phys Rev Lett 103, 150503, arXiv:0902.0402v2 [quant-ph], Oct. 9, 2009, 4 pages.
Roy et al., "Implementation of pairwise longitudinal coupling in a three-qubit superconducting circuit," Phys Rev Applied 7, 054025, arXiv:1610.07915v1 [quant-ph], Oct. 26, 2016, 16 pages.
Barends et al., "Logic gates at the surface code threshold: Superconducting qubits poised for fault-tolerant quantum computing," Nature, vol. 508, arXiv:1402.4848 [quant-ph], 2014, 15 pages.
Yan et al., "A tunable coupling scheme for implementing high-fidelity two-qubit gates," Phys Rev Applied 10, 054062, arXiv:1803.09813v1 [quant-ph], Mar. 26, 2018, 10 pages.
Arute et al., "Quantum supremacy using a programmable superconducting processor," Nature, vol. 574, https://doi.org/10.1038/s41586-019-1666-5, Oct. 24, 2019, pp. 505-510, 7 pages.
International Search Report and Written Opinion received for PCT Application Serial No. PCT/EP2021/067749 dated Oct. 14, 2021, 15 pages.
Han et al., "Elimination of unwanted qubit interactions for parametric exchange two-qubit gates in a tunable coupling circuit" arXiv:2003.08542v3 [quant ph] Aug. 28, 2020, 13 pages.
Hazra et al., "Engineering Cross Resonance Interaction in Multi-modal Quantum Circuits" Dec. 23, 2019, 10 pages.

* cited by examiner

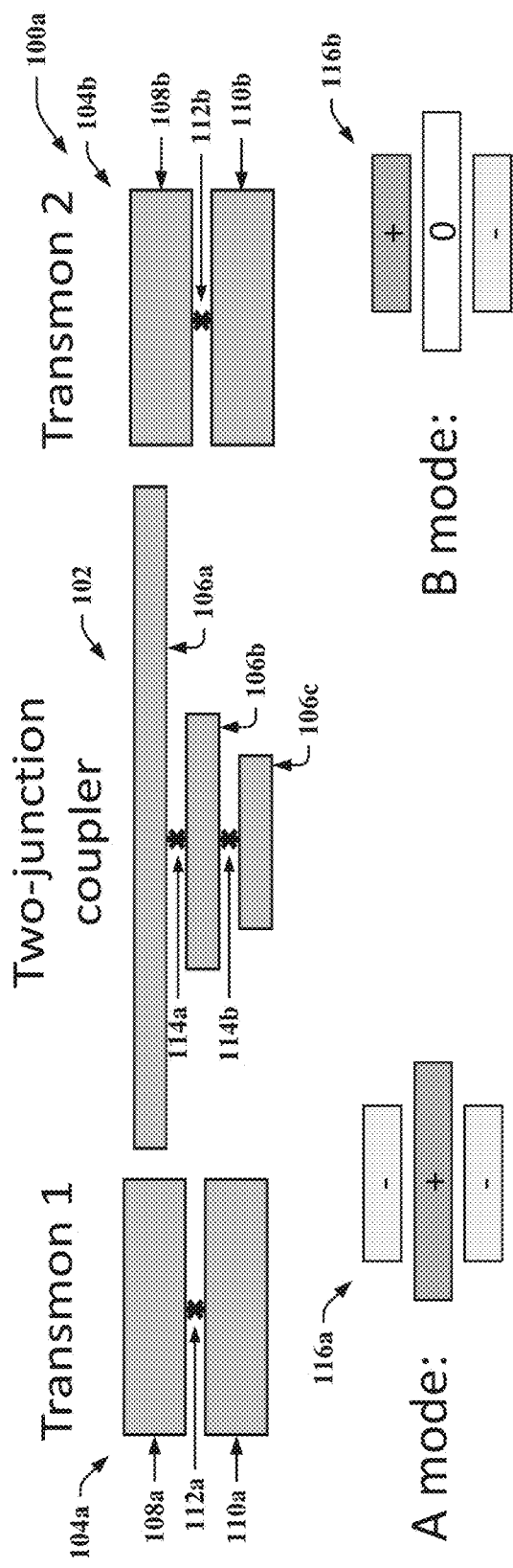
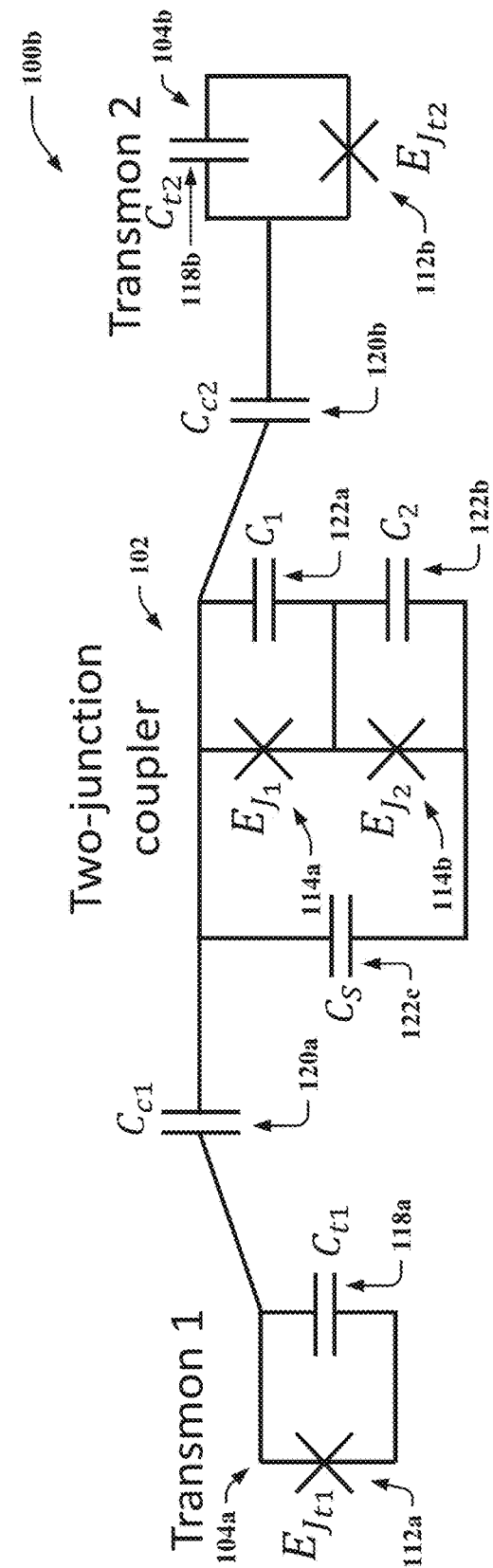
FIG. 1A
FIG. 1B

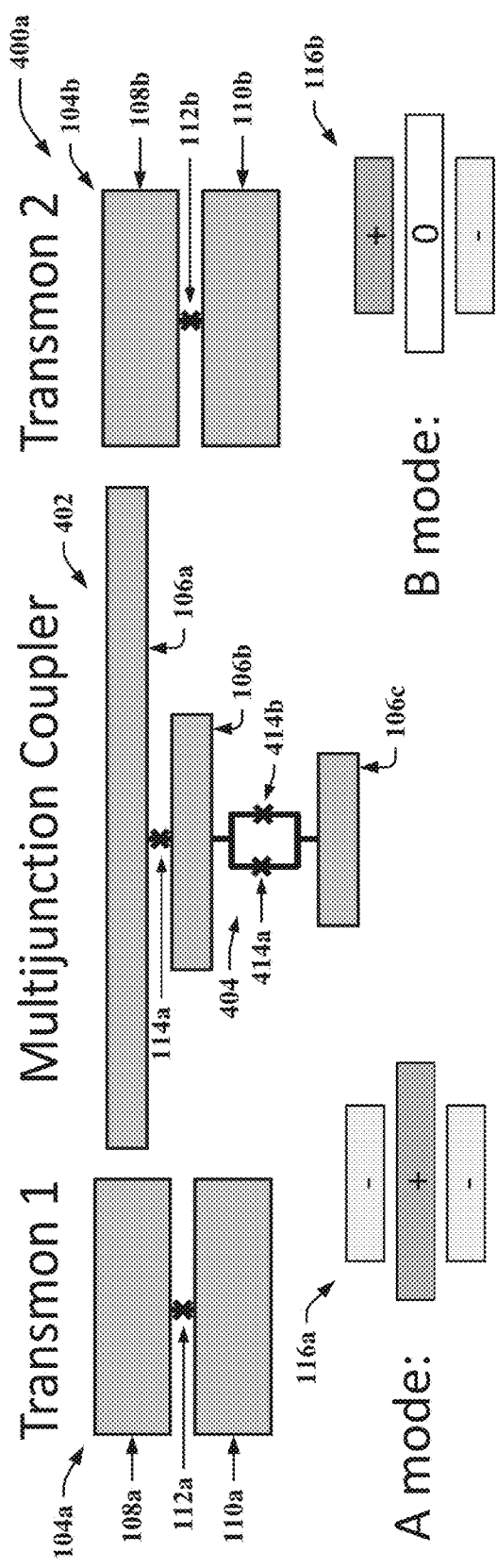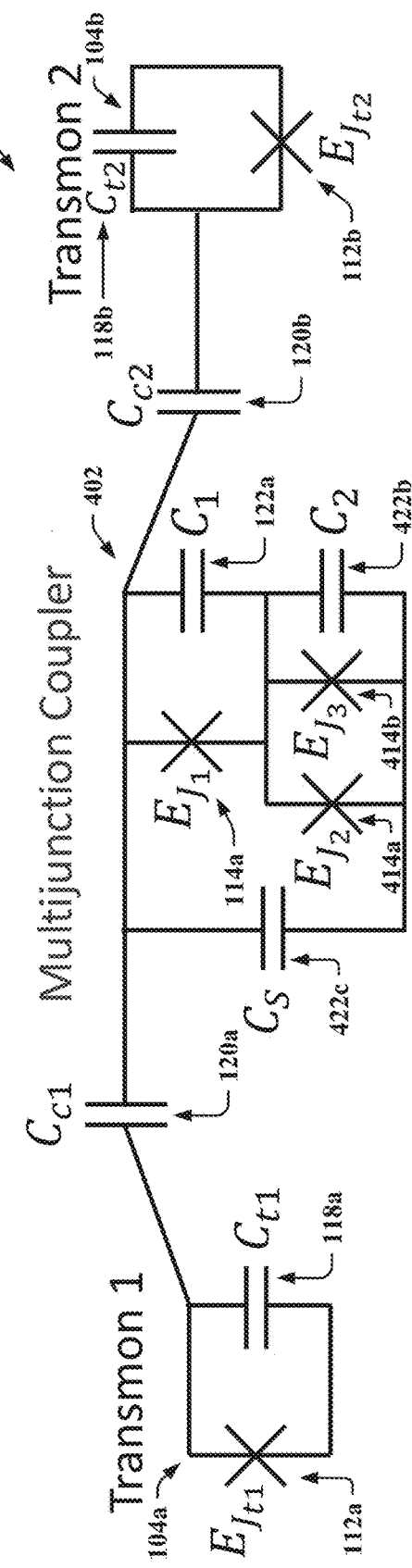
FIG. 4A
FIG. 4B

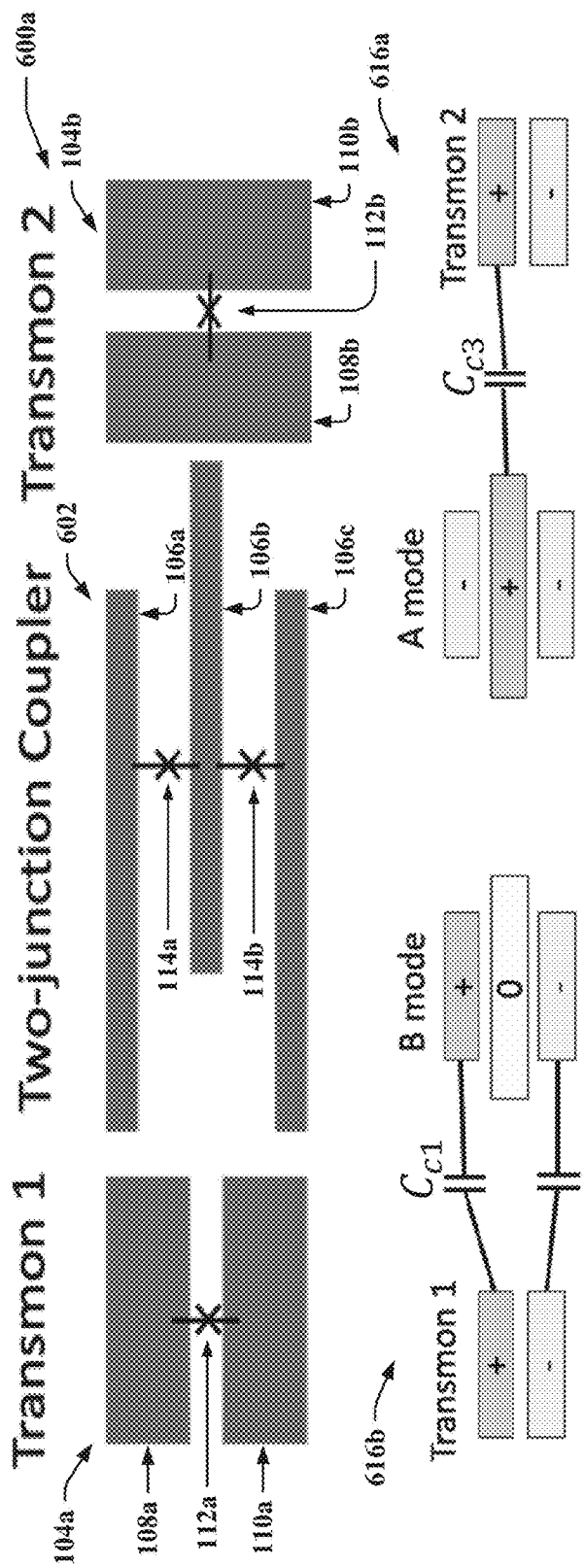
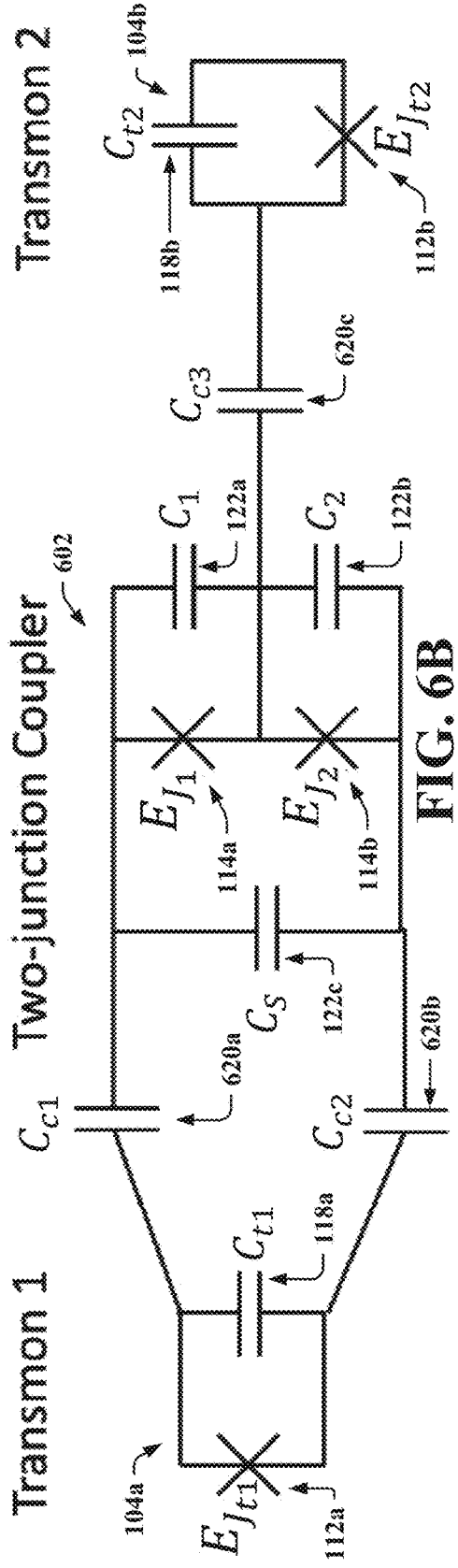
FIG. 6A
FIG. 6B

QUANTUM COUPLER FACILITATING SUPPRESSION OF ZZ INTERACTIONS BETWEEN QUBITS

BACKGROUND

The subject disclosure relates to a quantum coupler, and more specifically, to a quantum coupler facilitating suppression of ZZ interactions between quantum bits (qubits).

Qubits coupled via a bus have residual interactions with each other, even in the absence of external drives (e.g., external microwave pulses, magnetic fields, etc.). These residual interactions, known as ZZ interactions, can cause a qubit's frequency to be dependent on the state of its neighbors and can inhibit the fidelity of quantum operations.

Some prior art technologies use a two-junction qubit to enable tunable coupling to a readout resonator and as a method to encode multiple qubits within a single circuit. A problem with such prior art technologies is that they do not use the two-junction qubit as a fixed-frequency coupler between two transmon qubits. Other prior art technologies demonstrate flux-tunable couplers, but a problem with such prior art technologies is that they utilize only flux-tunable transmon qubits.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate ZZ cancellation between qubits are described.

According to an embodiment, a device can comprise a coupler device that operates in a first oscillating mode and a second oscillating mode. The device can further comprise a first superconducting qubit coupled to the coupler device based on a first oscillating mode structure corresponding to the first oscillating mode and based on a second oscillating mode structure corresponding to the second oscillating mode. The device can further comprise a second superconducting qubit coupled to the coupler device based on the first oscillating mode structure and the second oscillating mode structure. An advantage of such a device is that it can suppress ZZ interactions between the first superconducting qubit and the second superconducting qubit and/or improve the speed of a quantum gate (e.g., an entangling quantum gate) comprising such qubits.

In some embodiments, the first superconducting qubit and the second superconducting qubit have an equal exchange coupling with the first oscillating mode structure and the second oscillating mode structure based on a critical current of the coupler device. The equal exchange coupling suppresses ZZ interactions between the first superconducting qubit and the second superconducting qubit over a defined range of qubit frequencies, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the device. An advantage of such a device is that it can enable development of a logical qubit and/or a scalable quantum computer.

According to another embodiment, a computer-implemented method can comprise generating, by a system operatively coupled to a processor, an exchange coupling of a first superconducting qubit and a second superconducting qubit with a first oscillating mode structure and a second oscillating mode structure of a coupler device. The computer-implemented method can further comprise producing, by the system, an entangling quantum gate between the first superconducting qubit and the second superconducting qubit. An advantage of such a computer-implemented method is that it can be implemented to suppress ZZ interactions between the first superconducting qubit and the second superconducting qubit and/or improve the speed of a quantum gate (e.g., an entangling quantum gate) comprising such qubits.

In some embodiments, the above computer-implemented method can further comprise generating, by the system, an equal exchange coupling of the first superconducting qubit and the second superconducting qubit with the first oscillating mode structure and the second oscillating mode structure to suppress ZZ interactions between the first superconducting qubit and the second superconducting qubit over a defined range of qubit frequencies, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the coupler device, the first superconducting qubit, and the second superconducting qubit. An advantage of such a computer-implemented method is that it can be implemented to enable development of a logical qubit and/or a scalable quantum computer.

According to another embodiment, a device can comprise a coupler device that operates in a first oscillating mode and a second oscillating mode that are indicative of symmetric and antisymmetric combinations of excitations associated with a Josephson Junction and a flux controlled qubit device of the coupler device. The device can further comprise a first superconducting qubit coupled to the coupler device based on a first oscillating mode structure corresponding to the first oscillating mode and based on a second oscillating mode structure corresponding to the second oscillating mode. The device can further comprise a second superconducting qubit coupled to the coupler device based on the first oscillating mode structure and the second oscillating mode structure. An advantage of such a device is that it can suppress ZZ interactions between the first superconducting qubit and the second superconducting qubit and/or improve the speed of a quantum gate (e.g., an entangling quantum gate) comprising such qubits.

In some embodiments, the first superconducting qubit and the second superconducting qubit have an equal exchange coupling with the first oscillating mode structure and the second oscillating mode structure based on a critical current of the coupler device. The equal exchange coupling suppresses ZZ interactions between the first superconducting qubit and the second superconducting qubit over a defined range of qubit frequencies, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the device. An advantage of such a device is that it can enable development of a logical qubit and/or a scalable quantum computer.

According to another embodiment, a device can comprise a first superconducting qubit. The device can further comprise a second superconducting qubit. The device can further comprise a coupler device that operates in a first oscillating mode and a second oscillating mode and that comprises: a first superconducting pad coupled to the first superconducting qubit; a second superconducting pad coupled to the second superconducting qubit; and a third superconducting pad coupled to the first superconducting qubit. An advantage of such a device is that it can suppress ZZ interactions between the first superconducting qubit and the second superconducting qubit and/or improve the speed of a quantum gate (e.g., an entangling quantum gate) comprising such qubits.

In some embodiments, the first superconducting pad and the third superconducting pad are coupled to the first superconducting qubit based on a first oscillating mode structure corresponding to the first oscillating mode and the second superconducting pad is coupled to the second superconducting qubit based on a second oscillating mode structure corresponding to the second oscillating mode to reduce a direct exchange coupling between the first superconducting qubit and the second superconducting qubit and to suppress ZZ interactions between the first superconducting qubit and the second superconducting qubit, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the device. An advantage of such a device is that it can enable development of a logical qubit and/or a scalable quantum computer.

According to another embodiment, a computer-implemented method can comprise coupling, by a system operatively coupled to a processor, a first superconducting qubit to a first oscillating mode structure corresponding to a first oscillating mode of a coupler device. The computer-implemented method can further comprise coupling, by the system, a second superconducting qubit to a second oscillating mode structure corresponding to a second oscillating mode of the coupler device. The computer-implemented method can further comprise detuning, by the system, the coupler device from the first oscillating mode or the second oscillating mode. An advantage of such a computer-implemented method is that it can be implemented to suppress ZZ interactions between the first superconducting qubit and the second superconducting qubit and/or improve the speed of a quantum gate (e.g., an entangling quantum gate) comprising such qubits.

In some embodiments, the above computer-implemented method can further comprise coupling, by the system, the first superconducting qubit to the first oscillating mode structure and the second superconducting qubit to the second oscillating mode structure to reduce a direct exchange coupling between the first superconducting qubit and the second superconducting qubit and to suppress ZZ interactions between the first superconducting qubit and the second superconducting qubit, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the coupler device, the first superconducting qubit, and the second superconducting qubit. An advantage of such a computer-implemented method is that it can be implemented to enable development of a logical qubit and/or a scalable quantum computer.

DESCRIPTION OF THE DRAWINGS

FIG. 1A illustrates a top view of an example, non-limiting device that can facilitate ZZ cancellation between qubits in accordance with one or more embodiments described herein.

FIG. 1B illustrates an example, non-limiting circuit schematic of the device of FIG. 1A.

FIG. 4A illustrates a top view of an example, non-limiting device that can facilitate ZZ cancellation between qubits in accordance with one or more embodiments described herein.

FIG. 4B illustrates an example, non-limiting circuit schematic of the device of FIG. 4A.

FIG. 6A illustrates a top view of an example, non-limiting device that can facilitate ZZ cancellation between qubits in accordance with one or more embodiments described herein.

FIG. 6B illustrates an example, non-limiting circuit schematic of the device of FIG. 6A.

DETAILED DESCRIPTION

Figure 2:
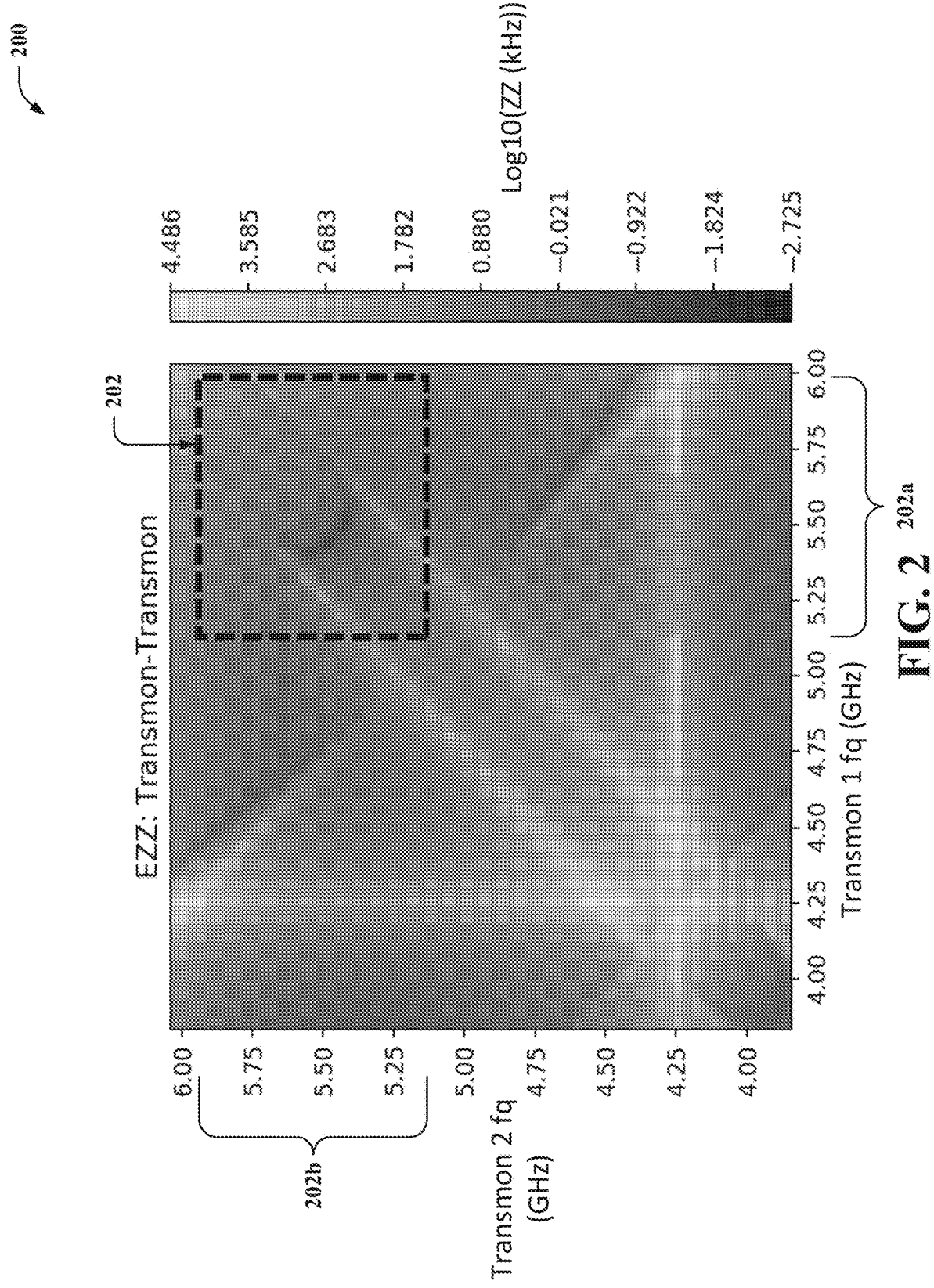
FIGS. 2, 3A, and 3B illustrate example, non-limiting graphs that can facilitate ZZ cancellation between qubits in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1, can entangle multiple quantum bits, and use interference.

Given the problems described above with prior art technologies, the present disclosure can be implemented to produce a solution to these problems in the form of devices and/or computer-implemented methods that can facilitate ZZ cancellation between qubits using a device comprising: a coupler device that operates in a first oscillating mode and a second oscillating mode; a first superconducting qubit coupled to the coupler device based on a first oscillating mode structure corresponding to the first oscillating mode and based on a second oscillating mode structure corresponding to the second oscillating mode; and a second superconducting qubit coupled to the coupler device based on the first oscillating mode structure and the second oscillating mode structure. An advantage of such devices and/or computer-implemented methods is that they can be implemented to suppress ZZ interactions between the first superconducting qubit and the second superconducting qubit and/or improve the speed of a quantum gate (e.g., an entangling quantum gate) comprising such qubits.

In some embodiments, the present disclosure can be implemented to produce a solution to the problems described above in the form of devices and/or computer-implemented methods where the first superconducting qubit and the second superconducting qubit have an equal exchange coupling with the first oscillating mode structure and the second oscillating mode structure based on a critical current of the coupler device, and where the equal exchange coupling suppresses ZZ interactions between the first superconducting qubit and the second superconducting qubit over a defined range of qubit frequencies, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the device described above. An advantage of such devices and/or computer-implemented methods is that they can be implemented to enable development of a logical qubit and/or a scalable quantum computer.

It will be understood that when an element is referred to as being "coupled" to another element, it can describe one or more different types of coupling including, but not limited to, chemical coupling, communicative coupling, electrical coupling, electromagnetic coupling, operative coupling, optical coupling, physical coupling, thermal coupling, and/or another type of coupling. It will also be understood that the following terms referenced herein are be defined as follows:

FIG. 1A illustrates a top view of an example, non-limiting device 100a that can facilitate ZZ cancellation between qubits in accordance with one or more embodiments described herein. FIG. 1B illustrates an example, non-limiting circuit schematic 100b of device 100a.

Device 100a can comprise a semiconducting and/or a superconducting device that can be implemented in a quantum device. For example, device 100a can comprise an integrated semiconducting and/or superconducting circuit (e.g., a quantum circuit) that can be implemented in a quantum device such as, for instance, quantum hardware, a quantum processor, a quantum computer, and/or another quantum device. Device 100a can comprise a semiconducting and/or a superconducting device such as, for instance, a quantum coupler device that can be implemented in such a quantum device defined above.

As illustrated by the example embodiment depicted in FIGS. 1A and 1B, device 100a can comprise a coupler device 102 (denoted as Two-junction coupler in FIGS. 1A and 1B) that can be coupled to a first superconducting qubit 104a (denoted as Transmon 1 in FIGS. 1A and 1B) and a second superconducting qubit 104b (denoted as Transmon 2 in FIGS. 1A and 1B). Coupler device 102 illustrated in the example embodiment depicted in FIGS. 1A and 1B can comprise at least one of a two junction qubit, a fixed frequency coupler, a multimode two junction coupler, a flux tunable coupler, a tunable coupler qubit, a flux tunable coupler qubit, a tunable qubit, a tunable bus, or a flux tunable qubit bus.

Coupler device 102 illustrated in the example embodiment depicted in FIGS. 1A and 1B can comprise a first superconducting pad 106a, a second superconducting pad 106b, and/or a third superconducting pad 106c, where each of such superconducting pads can comprise a superconducting film (e.g., a superconducting metal film) formed on a substrate (e.g., a silicon (Si) substrate, etc.). Coupler device 102 illustrated in the example embodiment depicted in FIGS. 1A and 1B can further comprise a first Josephson Junction 114a (denoted as $E_{J1}$ in FIG. 1B) coupled to first superconducting pad 106a and second superconducting pad 106b and/or a second Josephson Junction 114b (denoted as $E_{J2}$ in FIG. 1B) coupled to second superconducting pad 106b and third superconducting pad 106c. In this example embodiment, first Josephson Junction 114a and/or second Josephson Junction 114b can comprise one or more superconducting films (e.g., superconducting metal film(s)) and/or one or more non-superconducting films (e.g., normal metal film(s)) formed on a substrate (e.g., a silicon (Si) substrate, etc.).

As illustrated in the example embodiment depicted in FIG. 1B, first superconducting pad 106a and second superconducting pad 106b of coupler device 102 can be capacitively coupled to one another, where such capacitive coupling is represented in FIG. 1B by a first capacitor 122a (denoted as $C_1$ in FIG. 1B). As illustrated in the example embodiment depicted in FIG. 1B, second superconducting pad 106b and third superconducting pad 106c of coupler device 102 can be capacitively coupled to one another, where such capacitive coupling is represented in FIG. 1B by a second capacitor 122b (denoted as $C_2$ in FIG. 1B). In the example embodiment illustrated in FIG. 1B, first capacitor 122a and second capacitor 122b represent the direct capacitive shunting across first Josephson Junction 114a and second Josephson Junction 114b, respectively. In this example embodiment, as illustrated in FIGS. 1A and 1B, coupler device 102 can comprise two capacitively shunted Josephson Junctions, first Josephson Junction 114a and second Josephson Junction 114b, connected in series.

Coupler device 102 illustrated in the example embodiment depicted in FIGS. 1A and 1B can operate in a first oscillating mode and a second oscillating mode (not illustrated in the figures). In one or more embodiments of the subject disclosure described herein, the first oscillating mode and the second oscillating mode can correspond to different (e.g., distinct) frequencies and/or different (e.g., distinct) spatial symmetries with respect to one another. In these one or more embodiments, the first oscillating mode and the second oscillating mode can be indicative of symmetric and antisymmetric combinations of excitations associated with first Josephson Junction 114a and second Josephson Junction 114b of coupler device 102. In these one or more embodiments, such symmetric and antisymmetric combinations of excitations associated with first Josephson Junction 114a and second Josephson Junction 114b of coupler device 102 can result from a capacitive coupling of first superconducting pad 106a and third superconducting pad 106c, where such capacitive coupling is represented in FIG. 1B as a third capacitor 122c (denoted as $C_S$ in FIG. 1B).

In the example embodiment illustrated in FIGS. 1A and 1B, third capacitor 122c represents the capacitive coupling between first superconducting pad 106a and third superconducting pad 106c of coupler device 102, where such capacitive coupling can enable creation of the first oscillating mode and the second oscillating mode having different frequencies and different spatial symmetries relative to one another as described above. In this example embodiment, such capacitive coupling represented as third capacitor 122c in FIG. 1B can enable the first oscillating mode and the second oscillating mode to interact with each other, where such modes would otherwise be isolated across first Josephson Junction 114a and second Josephson Junction 114b of coupler device 102. In this example embodiment, such interaction between the first oscillating mode and the second oscillating mode can enable creation of extended states (e.g., hybridized quantum states, hybridized oscillating modes, etc.) of coupler device 102 (e.g., hybridized quantum states and/or hybridized oscillating modes corresponding to different frequencies and different spatial symmetries). In this example embodiment, such capacitive coupling represented as third capacitor 122c in FIG. 1B can enable the fundamental mode of coupler device 102 to extend across first Josephson Junction 114a and second Josephson Junction 114b, symmetrically or antisymmetrically.

The first oscillating mode and the second oscillating mode can respectively correspond to a first oscillating mode structure 116a (denoted as A mode in FIG. 1A) and a second oscillating mode structure 116b (denoted as B mode in FIG. 1A). First oscillating mode structure 116a and second oscillating mode structure 116b can each define a certain coupling technique (e.g., coupling scheme, coupling arrangement, coupling pattern, etc.) that can be used to couple first superconducting qubit 104a and/or second superconducting qubit 104b to coupler device 102 such that first superconducting qubit 104a and/or second superconducting qubit 104b can operate in accordance with the first oscillating mode and/or the second oscillating mode of coupler device 102.

First superconducting qubit 104a and/or second superconducting qubit 104b illustrated in the example embodiment depicted in FIGS. 1A and 1B can comprise at least one of a transmon qubit, a fixed frequency qubit, or a fixed frequency transmon qubit. First superconducting qubit 104a illustrated in the example embodiment depicted in FIGS. 1A and 1B can comprise a first superconducting pad 108a and/or a second superconducting pad 110a, where each of such superconducting pads can comprise a superconducting film (e.g., a superconducting metal film) formed on a substrate (e.g., a silicon (Si) substrate, etc.). First superconducting qubit 104a illustrated in the example embodiment depicted in FIGS. 1A and 1B can further comprise a Josephson Junction 112a (denoted as $E_{Jr1}$ in FIG. 1B) coupled to first superconducting pad 108a and second superconducting pad 110a. Second superconducting qubit 104b illustrated in the example embodiment depicted in FIGS. 1A and 1B can comprise a first superconducting pad 108b and/or a second superconducting pad 110b, where each of such superconducting pads can comprise a superconducting film (e.g., a superconducting metal film) formed on a substrate (e.g., a silicon (Si) substrate, etc.). Second superconducting qubit 104b illustrated in the example embodiment depicted in FIGS. 1A and 1B can further comprise a Josephson Junction 112b (denoted as $E_{Jr2}$ in FIG. 1B) coupled to first superconducting pad 108b and second superconducting pad 110b. In this example embodiment, Josephson Junction 112a of first superconducting qubit 104a and/or Josephson Junction 112b of second superconducting qubit 104b can each comprise one or more superconducting films (e.g., superconducting metal film(s)) and/or one or more non-superconducting films (e.g., normal metal film(s)) formed on a substrate (e.g., a silicon (Si) substrate, etc.).

As illustrated in the example embodiment depicted in FIG. 1B, first superconducting pad 108a and second superconducting pad 110a of first superconducting qubit 104a can be capacitively coupled to one another, where such capacitive coupling is represented in FIG. 1B by a capacitor 118a (denoted as $C_{r1}$ in FIG. 1B). As illustrated in the example embodiment depicted in FIG. 1B, first superconducting pad 108b and second superconducting pad 110b of second superconducting qubit 104b can be capacitively coupled to one another, where such capacitive coupling is represented in FIG. 1B by a capacitor 118b (denoted as $C_{r2}$ in FIG. 1B).

First superconducting qubit 104a and/or second superconducting qubit 104b illustrated in the example embodiment depicted in FIGS. 1A and 1B can be capacitively coupled to coupler device 102. For example, in an embodiment, first superconducting pad 108a of first superconducting qubit 104a and first superconducting pad 108b of second superconducting qubit 104b can each be capacitively coupled to first superconducting pad 106a of coupler device 102. As illustrated in the example embodiment depicted in FIG. 1B, first superconducting pad 108a of first superconducting qubit 104a and first superconducting pad 106a of coupler device 102 can be capacitively coupled to one another, where such capacitive coupling is represented in FIG. 1B by a capacitor 120a (denoted as $C_{c1}$ in FIG. 1B). As illustrated in the example embodiment depicted in FIG. 1B, first superconducting pad 108b of first superconducting qubit 104a and first superconducting pad 106a of coupler device 102 can be capacitively coupled to one another, where such capacitive coupling is represented in FIG. 1B by a capacitor 120b (denoted as $C_{c2}$ in FIG. 1B).

In various embodiments, first superconducting qubit 104a can be coupled to coupler device 102 based on (e.g., in accordance with) first oscillating mode structure 116a and second oscillating mode structure 116b described above and illustrated in FIG. 1A. In these embodiments, second superconducting qubit 104b can also be coupled to coupler device 102 based on (e.g., in accordance with) first oscillating mode structure 116a and second oscillating mode structure 116b described above and illustrated in FIG. 1A.

In various embodiments, an entity that fabricates and/or implements device 100a (e.g., a human, a computing device, a software application, an agent, a machine learning model, an artificial intelligence model, etc.) can select one or more critical currents of coupler device 102 (e.g., critical currents of first Josephson Junction 114a and/or second Josephson Junction 114b) such that first superconducting qubit 104a and second superconducting qubit 104b have equal exchange coupling with first oscillating mode structure 116a and second oscillating mode structure 116b. For instance, during fabrication of device 100a, such an entity defined above can select one or more superconducting materials to form coupler device 102 that have critical currents that can enable such equal exchange coupling of first superconducting qubit 104a and second superconducting qubit 104b with first oscillating mode structure 116a and second oscillating mode structure 116b. In another example, in implementing device 100a, such an entity defined above can adjust a magnetic field, an electrical current, an electrical potential, and/or a microwave pulse applied to device 100a and/or coupler device 102 (e.g., via one or more external devices and/or computer 1012 as described below) such that first superconducting qubit 104a and second superconducting qubit 104b have equal exchange coupling with first oscillating mode structure 116a and second oscillating mode structure 116b.

In the embodiments above, the equal exchange coupling of first superconducting qubit 104a and second superconducting qubit 104b with first oscillating mode structure 116a and second oscillating mode structure 116b can yield a net suppression (e.g., reduction, cancellation, etc.) of ZZ interactions (e.g., static ZZ interactions) between first superconducting qubit 104a and second superconducting qubit 104b over a defined range of qubit frequencies. For example, such an equal exchange coupling can yield a net suppression of ZZ interactions between first superconducting qubit 104a and second superconducting qubit 104b over a defined range of frequencies 202a corresponding to first superconducting qubit 104a and a defined range of frequencies 202b corresponding to second superconducting qubit 104b that are defined by region 202 as described below and illustrated in FIG. 2. In various embodiments, such a net suppression of ZZ interactions between first superconducting qubit 104a and second superconducting qubit 104b can thereby facilitate at least one of: reduced quantum gate errors associated with first superconducting qubit 104a and/or second superconducting qubit 104b; increased speed of a quantum gate (e.g., an entangling quantum gate) comprising first superconducting qubit 104a and second superconducting qubit 104b; and/or improved fidelity, improved accuracy, and/or improved performance of a quantum processor comprising device 100a.

In various embodiments, an entity implementing device 100a (e.g., a human, a computing device, a software application, an agent, a machine learning model, an artificial intelligence model, etc.) can further detune coupler device 102 from first oscillating mode structure 116a or second oscillating mode structure 116b, and thus, from the first oscillating mode or the second oscillating mode, to entangle first superconducting qubit 104a and second superconducting qubit 104b (e.g., to produce an entanglement quantum gate between first superconducting qubit 104a and second superconducting qubit 104b). In these embodiments, such entanglement of first superconducting qubit 104a and second superconducting qubit 104b can enable a quantum gate operation to be performed between first superconducting qubit 104a and second superconducting qubit 104b. For example, in these embodiments, based on detuning coupler device 102 from first oscillating mode structure 116a or second oscillating mode structure 116b, and thus, from the first oscillating mode or the second oscillating mode, device 100a and/or coupler device 102 can operate as a resonator-induced phase (RIP) gate, which can generate ZZ interactions between a first qubit (e.g., first superconducting qubit 104a) and a second qubit (e.g., second superconducting qubit 104b) that are present when there is a microwave drive (e.g., a microwave signal) at coupler device 102 (e.g., when there is a microwave signal applied to coupler device 102).

To facilitate such equal exchange coupling of first superconducting qubit 104a and second superconducting qubit 104b with first oscillating mode structure 116a and second oscillating mode structure 116b (e.g., to suppress static ZZ interactions between first superconducting qubit 104a and second superconducting qubit 104b) and/or to facilitate such detuning of coupler device 102 from first oscillating mode structure 116a and second oscillating mode structure 116b (e.g., to perform a quantum gate operation between first superconducting qubit 104a and second superconducting qubit 104b), in various embodiments, device 100a, coupler device 102, first superconducting qubit 104a, and/or second superconducting qubit 104b can be coupled to an external device (not illustrated in the figures). For example, in these embodiments, device 100a, coupler device 102, first superconducting qubit 104a, and/or second superconducting qubit 104b can be coupled to an external device that can be external to device 100a such as, for instance, a pulse generator device, an electrical power source, and/or a magnetic field generator.

In an example embodiment, although not depicted in FIG. 1A or 1B, device 100a, coupler device 102, first superconducting qubit 104a, and/or second superconducting qubit 104b can be coupled to a pulse generator device including, but not limited to, an arbitrary waveform generator (AWG), a vector network analyzer (VNA), and/or another pulse generator device that can be external to device 100a and can transmit and/or receive pulses (e.g., microwave pulses, microwave signals, control signals, etc.) to and/or from device 100a, coupler device 102, first superconducting qubit 104a, and/or second superconducting qubit 104b. In another example, embodiment, although not depicted in FIG. 1A or 1B, device 100a, coupler device 102, first superconducting qubit 104a, and/or second superconducting qubit 104b can be coupled to an electrical power source and/or a magnetic field generator that can be external to device 100a and can provide an electrical current, an electrical potential, and/or a magnetic field to device 100a, coupler device 102, first superconducting qubit 104a, and/or second superconducting qubit 104b.

In the example embodiments above, such an external device (e.g., a pulse generator device (e.g., an AWG, a VNA, etc.), an electrical power source, and/or a magnetic field generator) can also be coupled to a computer (e.g., computer 1012 described below with reference to FIG. 10) comprising a memory (e.g., system memory 1016 described below with reference to FIG. 10) that can store instructions thereon (e.g., software, routines, processing threads, etc.) and a processor (e.g., processing unit 1014 described below with reference to FIG. 10) that can execute such instructions that can be stored on the memory. In these example embodiments, such a computer can be employed to operate and/or control (e.g., via processing unit 1014 executing instructions stored on system memory 1016) such an external device (e.g., a pulse generator device (e.g., an AWG, a VNA, etc.), an electrical power source, and/or a magnetic field generator). For instance, in these example embodiments, such a computer can be employed to enable external device (e.g., a pulse generator device (e.g., an AWG, a VNA, etc.), an electrical power source, and/or a magnetic field generator) to: a) transmit and/or receive pulses (e.g., microwave pulses, microwave signals, control signals, etc.) to and/or from device 100a, coupler device 102, first superconducting qubit 104a, and/or second superconducting qubit 104b; and/or b) provide an electrical current, an electrical potential, and/or a magnetic field to device 100a, coupler device 102, first superconducting qubit 104a, and/or second superconducting qubit 104b.

In the embodiments described above, based on applying (e.g., via one or more of the external devices defined herein and/or computer 1012, etc.) an electrical current, an electrical potential, a microwave pulse (e.g., microwave signal, control signal, etc.), and/or a magnetic field to device 100a, coupler device 102, first superconducting qubit 104a, and/or second superconducting qubit 104b, an entity implementing device 100a can thereby facilitate: a) an equal exchange coupling of first superconducting qubit 104a and second superconducting qubit 104b with first oscillating mode structure 116a and second oscillating mode structure 116b (e.g., to suppress static ZZ interactions between first superconducting qubit 104a and second superconducting qubit 104b); and/or b) detuning of coupler device 102 from first oscillating mode structure 116a and second oscillating mode structure 116b (e.g., to perform a quantum gate operation between first superconducting qubit 104a and second superconducting qubit 104b).

Fabrication of the various embodiments of the subject disclosure described herein and/or illustrated in the figures (e.g., device 100a, 400a, 600a, etc.) can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, the various embodiments of the subject disclosure described herein and/or illustrated in the figures (e.g., device 100a, 400a, 600a, etc.) can be fabricated on a substrate (e.g., a silicon (Si) substrate, etc.) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

The various embodiments of the subject disclosure described herein and/or illustrated in the figures (e.g., device 100a, 400a, 600a, etc.) can be fabricated using various materials. For example, the various embodiments of the subject disclosure described herein and/or illustrated in the figures (e.g., device 100a, 400a, 600a, etc.) can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

FIG. 2 illustrates an example, non-limiting graph 200 that can facilitate ZZ cancellation between qubits in accordance with one or more embodiments described herein. Repetitive description of like elements and/or processes employed in respective embodiments is omitted for sake of brevity.

Graph 200 can comprise results data yielded from implementing one or more embodiments of the subject disclosure described herein. For example, graph 200 can comprise results data yielded from implementing (e.g., simulating, quantizing, etc.) device 100a in accordance with one or more embodiments of the subject disclosure described herein (e.g., computer-implemented methods 700, 800, and/or 900 described below with reference to FIGS. 7, 8, and 9, respectively).

Graph 200 can comprise a numerical simulation of the ZZ interactions (e.g., static ZZ interactions denoted as EZZ in FIG. 2) between first superconducting qubit 104a (denoted as Transmon 1 in FIG. 2) and second superconducting qubit 104b (denoted as Transmon 2 in FIG. 2) as a function of the frequencies of first superconducting qubit 104a and second superconducting qubit 104b. As illustrated in the example embodiment of graph 200 depicted in FIG. 2: the frequencies of first superconducting qubit 104a expressed in gigahertz (GHz) extend along the X-axis of graph 200 (denoted as Transmon 1 fq (GHz) in FIG. 2); the frequencies of second superconducting qubit 104b expressed in GHz extend along the Y-axis of graph 200 (denoted as Transmon 2 fq (GHz) in FIG. 2); and the ZZ interaction frequencies expressed in kilohertz (kHz) and denoted as Log 10 (ZZ (kHz)) in FIG. 2 are represented by varying shades of gray in the Z-axis of graph 200 (e.g., the axis of graph 200 extending into and out of the page) that correspond with frequencies denoted in the ZZ legend illustrated in FIG. 2.

As described with reference to the example embodiment illustrated in FIGS. 1A and 1B, the equal exchange coupling of first superconducting qubit 104a and second superconducting qubit 104b with the first oscillating mode and the second oscillating mode can yield a net suppression (e.g., reduction, cancellation, etc.) of ZZ interactions (e.g., static ZZ interactions) between first superconducting qubit 104a and second superconducting qubit 104b over a defined range of qubit frequencies. For example, with reference to region 202 defined on graph 200 illustrated in FIG. 2, such an equal exchange coupling can yield a net suppression of ZZ interactions between first superconducting qubit 104a and second superconducting qubit 104b over a defined range of frequencies 202a corresponding to first superconducting qubit 104a (e.g., from approximately 5.15 GHz to approximately 5.95 GHz). In this example, with reference to region 202 defined on graph 200 illustrated in FIG. 2, such an equal exchange coupling can also yield a net suppression of ZZ interactions between first superconducting qubit 104a and second superconducting qubit 104b over a defined range of frequencies 202b corresponding to second superconducting qubit 104b (e.g., from approximately 5.15 GHz to approximately 5.95 GHz).

Figure 3A:
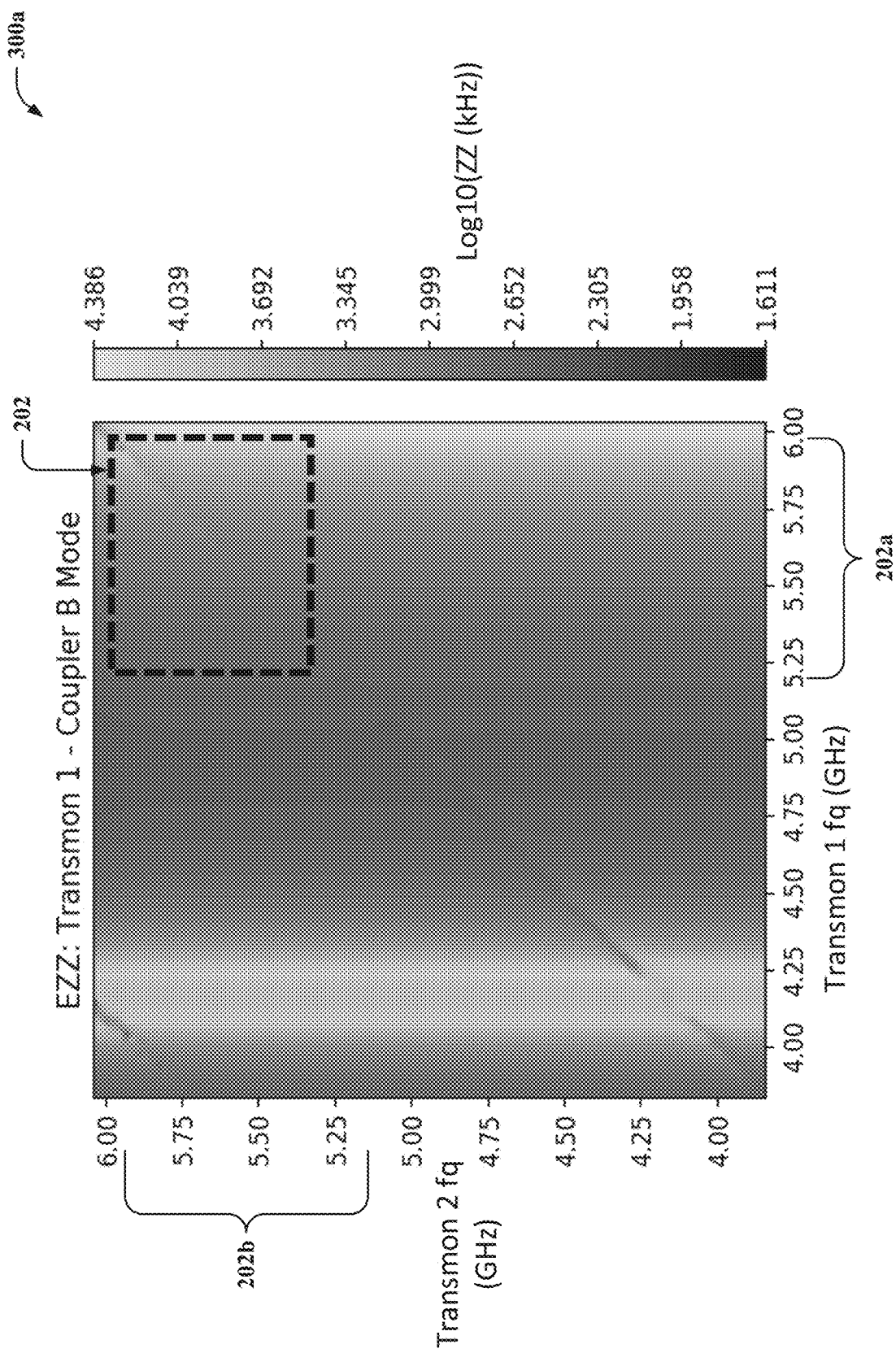

FIG. 3A illustrates an example, non-limiting graph 300a that can facilitate ZZ cancellation between qubits in accordance with one or more embodiments described herein. Repetitive description of like elements and/or processes employed in respective embodiments is omitted for sake of brevity.

Graph 300a can comprise results data yielded from implementing one or more embodiments of the subject disclosure described herein. For example, graph 300a can comprise results data yielded from implementing (e.g., simulating, quantizing, etc.) device 100a in accordance with one or more embodiments of the subject disclosure described herein (e.g., computer-implemented methods 700 and/or 900 described below with reference to FIGS. 7 and 9, respectively).

Graph 300a can comprise an example, non-limiting alternative embodiment of graph 200 described above with reference to FIG. 2. Graph 300a can comprise a numerical simulation of the ZZ interactions (e.g., static ZZ interactions denoted as EZZ in FIG. 3A) between first superconducting qubit 104a (denoted as Transmon 1 in FIG. 3A) and coupler device 102 (denoted as Coupler B Mode in FIG. 3A) as a function of the frequencies of first superconducting qubit 104a and second superconducting qubit 104b (denoted as Transmon 2 in FIG. 3A). More specifically, graph 300a can comprise a numerical simulation of the ZZ interactions between first superconducting qubit 104a and coupler device 102, where coupler device 102 is operating in the second oscillating mode and first superconducting qubit 104a is coupled to coupler device 102 based on (e.g., in accordance with) second oscillating mode structure 116b that corresponds to the second oscillating mode. As illustrated in the example embodiment of graph 300a depicted in FIG. 3A: the frequencies of first superconducting qubit 104a expressed in GHz extend along the X-axis of graph 300a (denoted as Transmon 1 fq (GHz) in FIG. 3A); the frequencies of second superconducting qubit 104b expressed in GHz extend along the Y-axis of graph 300a (denoted as Transmon 2 fq (GHz) in FIG. 3A); and the ZZ interaction frequencies expressed in kHz and denoted as Log 10 (ZZ (kHz)) in FIG. 3A are represented by varying shades of gray in the Z-axis of graph 300a (e.g., the axis of graph 300a extending into and out of the page) that correspond with frequencies denoted in the ZZ legend illustrated in FIG. 3A. As illustrated by region 202 defined on graph 300a depicted in FIG. 3A, the ZZ interactions between first superconducting qubit 104a and second superconducting qubit 104b are suppressed (e.g., relatively small, negligible, effectively cancelled, etc.), while the ZZ interactions between first superconducting qubit 104a and coupler device 102 operating in the second oscillating mode are enhanced (e.g., relatively large, increased, etc.).

Figure 3B:
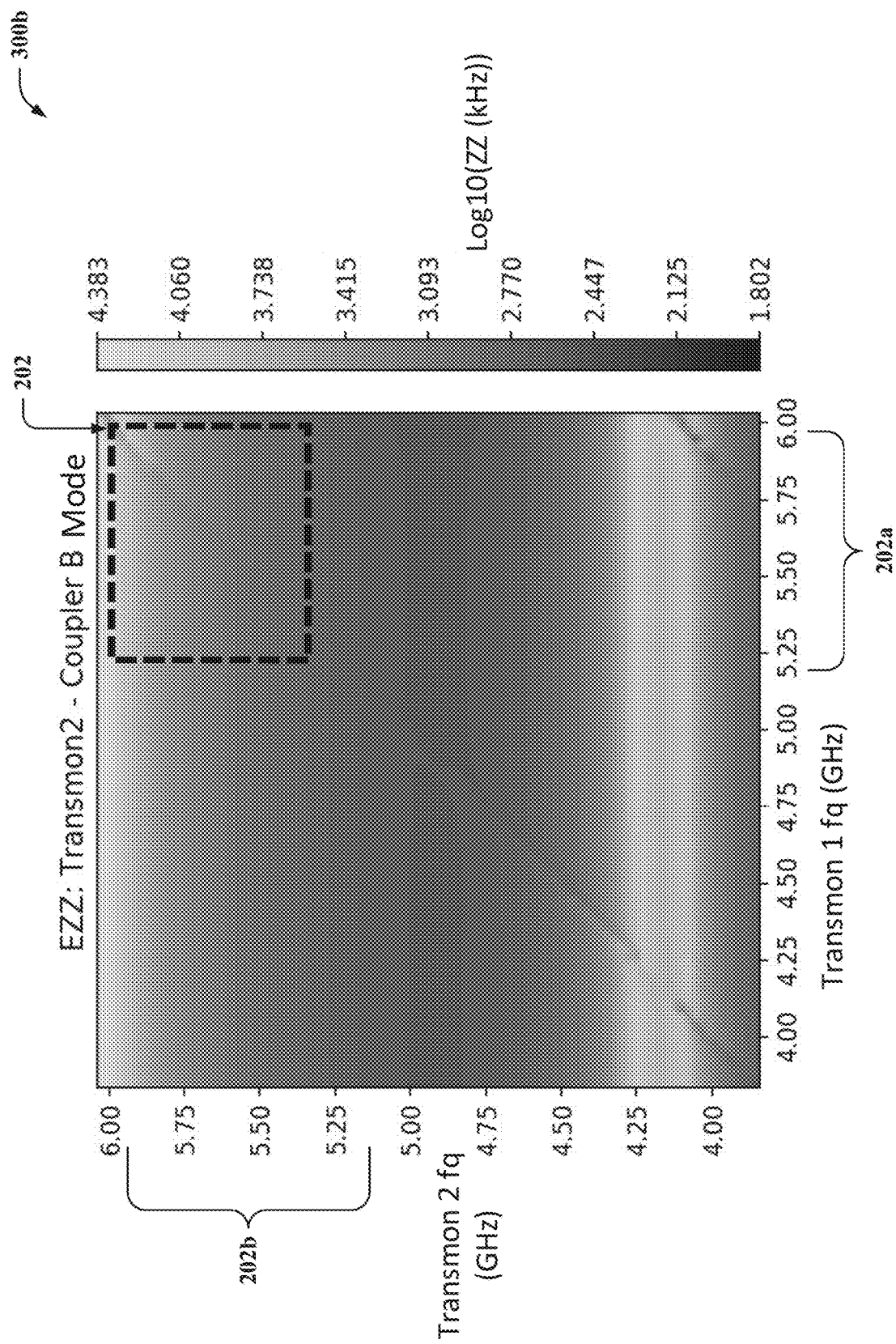

FIG. 3B illustrates an example, non-limiting graph 300b that can facilitate ZZ cancellation between qubits in accordance with one or more embodiments described herein. Repetitive description of like elements and/or processes employed in respective embodiments is omitted for sake of brevity.

Graph 300b can comprise results data yielded from implementing one or more embodiments of the subject disclosure described herein. For example, graph 300b can comprise results data yielded from implementing (e.g., simulating, quantizing, etc.) device 100a in accordance with one or more embodiments of the subject disclosure described herein (e.g., computer-implemented methods 700, 800, and/or 900 described below with reference to FIGS. 7, 8, and 9, respectively).

Graph 300b can comprise an example, non-limiting alternative embodiment of graph 300a described above with reference to FIG. 3A. Graph 300b can comprise a numerical simulation of the ZZ interactions (e.g., static ZZ interactions denoted as EZZ in FIG. 3B) between second superconducting qubit 104b (denoted as Transmon 2 in FIG. 3B) and coupler device 102 (denoted as Coupler B Mode in FIG. 3B) as a function of the frequencies of first superconducting qubit 104a and second superconducting qubit 104b (denoted as Transmon 2 in FIG. 3A). More specifically, graph 300b can comprise a numerical simulation of the ZZ interactions between second superconducting qubit 104b and coupler device 102, where coupler device 102 is operating in the second oscillating mode and second superconducting qubit 104b is coupled to coupler device 102 based on (e.g., in accordance with) second oscillating mode structure 116b that corresponds to the second oscillating mode. As illustrated in the example embodiment of graph 300b depicted in FIG. 3B: the frequencies of first superconducting qubit 104a expressed in GHz extend along the X-axis of graph 300b (denoted as Transmon 1 fq (GHz) in FIG. 3B); the frequencies of second superconducting qubit 104b expressed in GHz extend along the Y-axis of graph 300b (denoted as Transmon 2 fq (GHz) in FIG. 3B); and the ZZ interaction frequencies expressed in kHz and denoted as Log 10 (ZZ (kHz)) in FIG. 3B are represented by varying shades of gray in the Z-axis of graph 300b (e.g., the axis of graph 300b extending into and out of the page) that correspond with frequencies denoted in the ZZ legend illustrated in FIG. 3B. As illustrated by region 202 defined on graph 300b depicted in FIG. 3B, the ZZ interactions between first superconducting qubit 104a and second superconducting qubit 104b are suppressed (e.g., relatively small, negligible, effectively cancelled, etc.), while the ZZ interactions between second superconducting qubit 104b and coupler device 102 operating in the second oscillating mode are enhanced (e.g., relatively large, increased, etc.).

FIG. 4A illustrates a top view of an example, non-limiting device 400a that can facilitate ZZ cancellation between qubits in accordance with one or more embodiments described herein. FIG. 4B illustrates an example, non-limiting circuit schematic 400b of device 400a.

Device 400a can comprise an example, non-limiting alternative embodiment of device 100a described above with reference to FIGS. 1A and 1B, where device 400a can comprise a flux tunable embodiment of device 100a. Device 400a can comprise an example, non-limiting alternative embodiment of device 100a described above with reference to FIGS. 1A and 1B, where device 400a can comprise a coupler device 402 (denoted as Multijunction Coupler in FIGS. 4A and 4B) in place of coupler device 102. Coupler device 402 can comprise an example, non-limiting alternative embodiment of coupler device 102, where coupler device 402 can comprise a flux controlled qubit device 404 in place of second Josephson Junction 114b as illustrated in the example embodiment depicted in FIGS. 4A and 4B. For example, coupler device 402 can comprise flux controlled qubit device 404 coupled to second superconducting pad 106b and third superconducting pad 106c as illustrated in the example embodiment depicted in FIGS. 4A and 4B.

Flux controlled qubit device 404 can comprise a superconducting quantum interference device (SQUID) loop. As illustrated in the example embodiment depicted in FIGS. 4A and 4B, flux controlled qubit device 404 can comprise a second Josephson Junction 414a of coupler device 402 (denoted as $E_{J2}$ in FIG. 4B, where first Josephson Junction 114a denoted as $E_{J1}$ in FIG. 4B and described above with reference to FIGS. 1A and 1B represents a first Josephson Junction of coupler device 402). As illustrated in the example embodiment depicted in FIGS. 4A and 4B, flux controlled qubit device 404 can comprise a third Josephson Junction 414b of coupler device 402 (denoted as $E_{J3}$ in FIG. 4B). In this example embodiment, second Josephson Junction 414a and/or third Josephson Junction 414b can comprise one or more superconducting films (e.g., superconducting metal film(s)) and/or one or more non-superconducting films (e.g., normal metal film(s)) formed on a substrate (e.g., a silicon (Si) substrate, etc.).

As illustrated in the example embodiment depicted in FIG. 4B, second superconducting pad 106b and third superconducting pad 106c of coupler device 402 can be capacitively coupled to one another, where such capacitive coupling is represented in FIG. 4B by a second capacitor 422b of coupler device 402 (denoted as $C_2$ in FIG. 4B, where first capacitor 122a denoted as $C_1$ in FIG. 4B and described above with reference to FIGS. 1A and 1B represents a first capacitor of coupler device 402). In the example embodiment illustrated in FIG. 4B, first capacitor 122a and second capacitor 422b represent the direct capacitive shunting across first Josephson Junction 114a and flux controlled qubit device 404 (e.g., across second Josephson Junction 414a and third Josephson Junction 414b), respectively. In this example embodiment, as illustrated in FIGS. 4A and 4B, coupler device 102 can comprise a capacitively shunted first Josephson Junction 114a and a capacitively shunted flux controlled qubit device 404 connected in series.

Coupler device 402 illustrated in the example embodiment depicted in FIGS. 4A and 4B can operate in the first oscillating mode and the second oscillating mode. In one or more embodiments of the subject disclosure described herein, the first oscillating mode and the second oscillating mode can correspond to different (e.g., distinct) frequencies and/or different (e.g., distinct) spatial symmetries with respect to one another. In these one or more embodiments, the first oscillating mode and the second oscillating mode can be indicative of symmetric and antisymmetric combinations of excitations associated with first Josephson Junction 114a and flux controlled qubit device 404 (e.g., associated with second Josephson Junction 414a and third Josephson Junction 414b) of coupler device 402. In these one or more embodiments, such symmetric and antisymmetric combinations of excitations associated with first Josephson Junction 114a and flux controlled qubit device 404 (e.g., associated with second Josephson Junction 414a and third Josephson Junction 414b) of coupler device 402 can result from a capacitive coupling of first superconducting pad 106a and third superconducting pad 106c, where such capacitive coupling is represented in FIG. 4B as third capacitor 122c (denoted as $C_S$ in FIG. 4B).

In the example embodiment illustrated in FIGS. 4A and 4B, third capacitor 122c represents the capacitive coupling between first superconducting pad 106a and third superconducting pad 106c of coupler device 402, where such capacitive coupling can enable creation of the first oscillating mode and the second oscillating mode having different frequencies and different spatial symmetries relative to one another as described above. In this example embodiment, such capacitive coupling represented as third capacitor 122c in FIG. 4B can enable the first oscillating mode and the second oscillating mode to interact with each other, where such modes would otherwise be isolated across first Josephson Junction 114a and flux controlled qubit device 404 (e.g., isolated across second Josephson Junction 414a and third Josephson Junction 414b) of coupler device 402. In this example embodiment, such interaction between the first oscillating mode and the second oscillating mode can enable creation of extended states (e.g., hybridized quantum states, hybridized oscillating modes, etc.) of coupler device 402 (e.g., hybridized quantum states and/or hybridized oscillating modes corresponding to different frequencies and different spatial symmetries). In this example embodiment, such capacitive coupling represented as third capacitor 122c in FIG. 4B can enable the fundamental mode of coupler device 402 to extend across first Josephson Junction 114a and flux controlled qubit device 404 (e.g., to extend across second Josephson Junction 414a and third Josephson Junction 414b), symmetrically or antisymmetrically.

In the example embodiment illustrated in FIGS. 4A and 4B, the first oscillating mode and the second oscillating mode can respectively correspond to first oscillating mode structure 116a and second oscillating mode structure 116b described above with reference to FIGS. 1A and 1B. In this example embodiment, first oscillating mode structure 116a and second oscillating mode structure 116b can each define a certain coupling technique (e.g., coupling scheme, coupling arrangement, coupling pattern, etc.) that can be used to couple first superconducting qubit 104a and/or second superconducting qubit 104b to coupler device 402 such that first superconducting qubit 104a and/or second superconducting qubit 104b can operate in accordance with the first oscillating mode and/or the second oscillating mode of coupler device 402. For instance, in this example embodiment, first superconducting qubit 104a and/or second superconducting qubit 104b can be coupled to coupler device 402 in the same or substantially similar manner as first superconducting qubit 104a and/or second superconducting qubit 104b can be coupled to coupler device 102 as described above with reference to FIGS. 1A and 1B. For example, first superconducting qubit 104a and/or second superconducting qubit 104b can be capacitively coupled to coupler device 402 in accordance with first oscillating mode structure 116a and second oscillating mode structure 116b, where such capacitive coupling is represented in the example embodiment depicted in FIG. 4B as capacitor 120a and capacitor 120b, respectively.

In various embodiments, the critical current of flux controlled qubit device 404 can be dependent on an external magnetic field. Consequently, in these embodiments, an entity that implements device 400a (e.g., a human, a computing device, a software application, an agent, a machine learning model, an artificial intelligence model, etc.) can tune (e.g., adjust) one or more critical currents of coupler device 402 (e.g., critical currents of first Josephson Junction 114a and/or flux controlled qubit device 404) such that first superconducting qubit 104a and second superconducting qubit 104b have equal exchange coupling with first oscillating mode structure 116a and second oscillating mode structure 116b. For instance, in these embodiments, such an entity defined above can adjust a magnetic field applied to device 400a, coupler device 402, first Josephson Junction 114a, and/or flux controlled qubit device 404 (e.g., via a magnetic field generator and/or computer 1012 as described above with reference to FIGS. 1A and 1B) such that first superconducting qubit 104a and second superconducting qubit 104b have equal exchange coupling with first oscillating mode structure 116a and second oscillating mode structure 116b. In these embodiments, such an entity defined above can tune (e.g., turn on or turn off) the ZZ interactions between first superconducting qubit 104a and second superconducting qubit 104b by applying an external magnetic field to coupler device 402, first Josephson Junction 114a, and/or flux controlled qubit device 404 that will change the critical current of first Josephson Junction 114a or flux controlled qubit device 404, thereby causing an enhancement (e.g., increase) or a suppression (e.g., decrease) of the ZZ interactions.

In the embodiments above, the equal exchange coupling of first superconducting qubit 104a and second superconducting qubit 104b with first oscillating mode structure 116a and second oscillating mode structure 116b can yield a net suppression (e.g., reduction, cancellation, etc.) of ZZ interactions (e.g., static ZZ interactions) between first superconducting qubit 104a and second superconducting qubit 104b at or approximately at a certain critical current of flux controlled qubit device 404. For example, such an equal exchange coupling can yield a net suppression of ZZ interactions between first superconducting qubit 104a and second superconducting qubit 104b at or approximately at a certain critical current of flux controlled qubit device 404 denoted in graph 500 as off position 504 (e.g., at or approximately at a critical current of approximately 39 nanoamperes (nA) as described below and illustrated in FIG. 5). In various embodiments, such a net suppression of ZZ interactions between first superconducting qubit 104a and second superconducting qubit 104b can thereby facilitate at least one of: reduced quantum gate errors associated with first superconducting qubit 104a and/or second superconducting qubit 104b; increased speed of a quantum gate (e.g., an entangling quantum gate) comprising first superconducting qubit 104a and second superconducting qubit 104b; and/or improved fidelity, improved accuracy, and/or improved performance of a quantum processor comprising device 400a.

In the embodiments above, such an entity implementing device 400a can further adjust (e.g., via a magnetic field generator and/or computer 1012) an external magnetic field that can be applied to coupler device 402 to detune coupler device 402 from first oscillating mode structure 116a or second oscillating mode structure 116b (e.g., from the first oscillating mode or the second oscillating mode), which can enable entanglement of first superconducting qubit 104a and second superconducting qubit 104b. For example, in these embodiments, such an entity defined above can adjust an external magnetic field that can be applied to coupler device 402 to tune a critical current of flux controlled qubit device 404 to a certain critical current or approximately to such a certain critical current of flux controlled qubit device 404 denoted in graph 500 as on position 502 (e.g., at or approximately at a critical current of approximately 26.5 nA as described below and illustrated in FIG. 5).

In the embodiments above, such entanglement of first superconducting qubit 104a and second superconducting qubit 104b can enable a quantum gate operation to be performed between first superconducting qubit 104a and second superconducting qubit 104b. For example, in these embodiments, based on detuning (e.g., via a magnetic field generator and/or computer 1012) coupler device 402 from first oscillating mode structure 116a or second oscillating mode structure 116b (e.g., from the first oscillating mode or the second oscillating mode), device 400a and/or coupler device 402 can operate as a resonator-induced phase (RIP) gate, which can generate ZZ interactions between a first qubit (e.g., first superconducting qubit 104a) and a second qubit (e.g., second superconducting qubit 104b) that are present when there is a microwave drive (e.g., a microwave signal) at coupler device 402 (e.g., when there is a microwave signal applied to coupler device 402).

Figure 5:
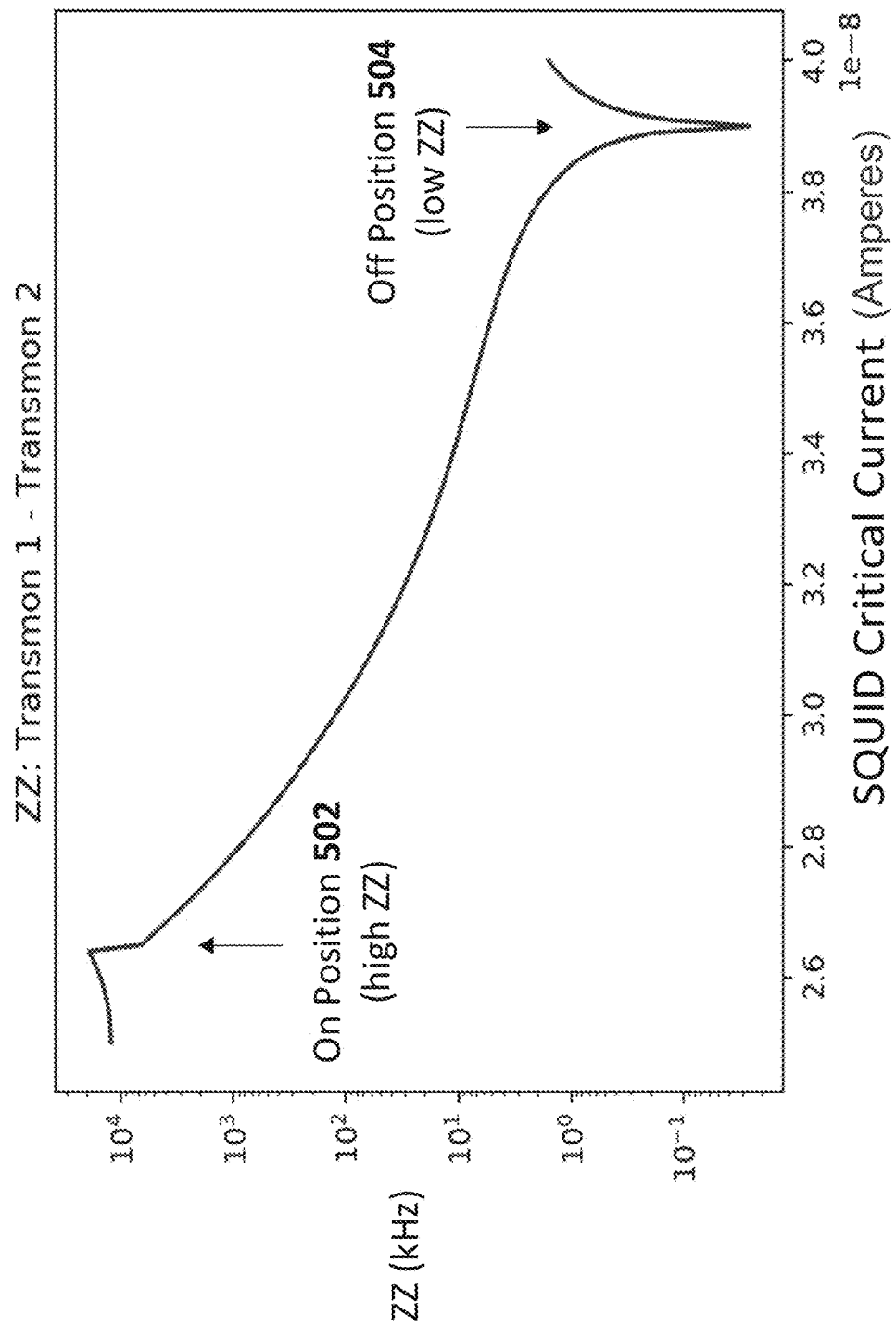
FIG. 5 illustrates an example, non-limiting graph that can facilitate ZZ cancellation between qubits in accordance with one or more embodiments described herein.

FIG. 5 illustrates an example, non-limiting graph 500 that can facilitate ZZ cancellation between qubits in accordance with one or more embodiments described herein. Repetitive description of like elements and/or processes employed in respective embodiments is omitted for sake of brevity.

Graph 500 can comprise results data yielded from implementing one or more embodiments of the subject disclosure described herein. For example, graph 500 can comprise results data yielded from implementing (e.g., simulating, quantizing, etc.) device 400a in accordance with one or more embodiments of the subject disclosure described herein (e.g., computer-implemented methods 700 and/or 900 described below with reference to FIGS. 7 and 9, respectively).

Graph 500 can comprise a simulation of ZZ interactions (denoted along the Y-axis of graph 500 and expressed in kHz) between first superconducting qubit 104a and second superconducting qubit 104b as a function of flux controlled qubit device 404 critical current (denoted along the X-axis of graph 500 and expressed in units of amperes (A)).

In the example embodiment illustrated in FIG. 5, on position 502 corresponds to a low value of flux controlled qubit device 404 critical current (e.g., approximately 26.5 nA) and a high value of ZZ interactions (e.g., approximately greater than 1 megahertz (MHz)) between first superconducting qubit 104a and second superconducting qubit 104b. In this example embodiment, such a high value of ZZ interactions (e.g., approximately greater than 1 megahertz (MHz)) between first superconducting qubit 104a and second superconducting qubit 104b can enable entanglement of first superconducting qubit 104a and second superconducting qubit 104b (e.g., to perform a quantum gate operation between first superconducting qubit 104a and second superconducting qubit 104b). In this example embodiment, as described above with reference to FIGS. 1A, 1B, 4A, and 4B, an entity implementing device 400a can adjust (e.g., via a magnetic field generator and/or computer 1012) an external magnetic field that can be applied to coupler device 402 to tune the critical current of flux controlled qubit device 404 to a certain critical current corresponding to on position 502 defined in graph 500 depicted in FIG. 5 (e.g., approximately 26.5 nA).

In the example embodiment illustrated in FIG. 5, off position 504 corresponds to a high value of flux controlled qubit device 404 critical current (e.g., approximately 39 nA) and a low value of ZZ interactions (e.g., approximately less than 1 kHz) between first superconducting qubit 104a and second superconducting qubit 104b. In this example embodiment, such a low value of ZZ interactions (e.g., approximately less than 1 kHz) can enable reduced quantum gate errors associated with first superconducting qubit 104a and/or second superconducting qubit 104b in performing quantum gates. In this example embodiment, as described above with reference to FIGS. 1A, 1B, 4A, and 4B, an entity implementing device 400a can adjust (e.g., via a magnetic field generator and/or computer 1012) an external magnetic field that can be applied to coupler device 402 to tune the critical current of flux controlled qubit device 404 to a certain critical current corresponding to off position 504 defined in graph 500 depicted in FIG. 5 (e.g., approximately 39 nA).

FIG. 6A illustrates a top view of an example, non-limiting device 600a that can facilitate ZZ cancellation between qubits in accordance with one or more embodiments described herein. FIG. 6B illustrates an example, non-limiting circuit schematic 600b of device 600a.

Device 600a can comprise an example, non-limiting alternative embodiment of device 100a described above with reference to FIGS. 1A and 1B, where device 600a can comprise a coupler device 402 (denoted as Two-junction Coupler in FIGS. 6A and 6B) in place of coupler device 102. Coupler device 602 can comprise an example, non-limiting alternative embodiment of coupler device 102, where first superconducting pad 106a and third superconducting pad 106c of coupler device 602 can be coupled to first superconducting qubit 104a (denoted as Transmon 1 in FIGS. 6A and 6B) and second superconducting pad 106b of coupler device 602 can be coupled to second superconducting qubit 104b (denoted as Transmon 2 in FIGS. 6A and 6B).

Coupler device 602 illustrated in the example embodiment depicted in FIGS. 6A and 6B can operate in a first oscillating mode 624a and a second oscillating mode 624b (not illustrated in the figures). In one or more embodiments of the subject disclosure described herein, first oscillating mode 624a and second oscillating mode 624b can correspond to different (e.g., distinct) frequencies and/or different (e.g., distinct) spatial symmetries with respect to one another. In these one or more embodiments, first oscillating mode 624a and second oscillating mode 624b can be indicative of symmetric and antisymmetric combinations of excitations associated with first Josephson Junction 114a and second Josephson Junction 114b of coupler device 602. In these one or more embodiments, such symmetric and antisymmetric combinations of excitations associated with first Josephson Junction 114a and second Josephson Junction 114b of coupler device 602 can result from a capacitive coupling of first superconducting pad 106a and third superconducting pad 106c, where such capacitive coupling is represented in FIG. 6B as third capacitor 122c (denoted as $C_S$ in FIG. 6B).

In the example embodiment illustrated in FIGS. 6A and 6B, third capacitor 122c represents the capacitive coupling between first superconducting pad 106a and third superconducting pad 106c of coupler device 602, where such capacitive coupling can enable creation of first oscillating mode 624a and second oscillating mode 624b having different frequencies and different spatial symmetries relative to one another as described above. In this example embodiment, such capacitive coupling represented as third capacitor 122c in FIG. 6B can enable first oscillating mode 624a and second oscillating mode 624b to interact with each other, where such modes would otherwise be isolated across first Josephson Junction 114a and second Josephson Junction 114b of coupler device 602. In this example embodiment, such interaction between first oscillating mode 624a and second oscillating mode 624b can enable creation of extended states (e.g., hybridized quantum states, hybridized oscillating modes, etc.) of coupler device 602 (e.g., hybridized quantum states and/or hybridized oscillating modes corresponding to different frequencies and different spatial symmetries). In this example embodiment, such capacitive coupling represented as third capacitor 122c in FIG. 6B can enable the fundamental mode of coupler device 602 to extend across first Josephson Junction 114a and second Josephson Junction 114b, symmetrically or antisymmetrically.

First oscillating mode 624a and second oscillating mode 624b can respectively correspond to a first oscillating mode structure 616a (denoted as A mode in FIG. 6A) and a second oscillating mode structure 616b (denoted as B mode in FIG. 6A). First oscillating mode structure 616a and second oscillating mode structure 616b can each define a certain coupling technique (e.g., coupling scheme, coupling arrangement, coupling pattern, etc.) that can be used to couple first superconducting qubit 104a and/or second superconducting qubit 104b to coupler device 602 such that first superconducting qubit 104a and/or second superconducting qubit 104b can operate in accordance with first oscillating mode 624a and/or second oscillating mode 624b of coupler device 602.

As described above, first superconducting qubit 104a and/or second superconducting qubit 104b illustrated in the example embodiment depicted in FIGS. 6A and 6B can be coupled to coupler device 602. For example, as illustrated in the example embodiment depicted in FIGS. 6A and 6B: first superconducting pad 106a of coupler device 602 can be capacitively coupled to first superconducting pad 108a of first superconducting qubit 104a, where such capacitive coupling is represented in FIG. 6B by a capacitor 620a (denoted as $C_{c1}$ in FIG. 6B); third superconducting pad 106c of coupler device 602 can be capacitively coupled to second superconducting pad 110a of first superconducting qubit 104a, where such capacitive coupling is represented in FIG. 6B by a capacitor 120b (denoted as $C_{c2}$ in FIG. 6B); and second superconducting pad 106b of coupler device 602 can be capacitively coupled to first superconducting pad 108b of second superconducting qubit 104b, where such capacitive coupling is represented in FIG. 6B by a capacitor 620c (denoted as $C_{c3}$ in FIG. 1B).

In various embodiments, first superconducting qubit 104a can be coupled to coupler device 602 based on (e.g., in accordance with) second oscillating mode structure 616b described above and illustrated in FIG. 6A. In these embodiments, second superconducting qubit 104b can be coupled to coupler device 602 based on (e.g., in accordance with) first oscillating mode structure 616a described above and illustrated in FIG. 6A. In these embodiments, because first superconducting qubit 104a and second superconducting qubit 104b can be coupled to distinct modes of coupler device 602 as described above (e.g., first superconducting qubit 104a capacitively coupled to second oscillating mode structure 616b corresponding to second oscillating mode 624b and second superconducting qubit 104b capacitively coupled to first oscillating mode structure 616a corresponding to first oscillating mode 624a), there is virtually no direct exchange coupling (e.g., negligible direct exchange coupling) between first superconducting qubit 104a and second superconducting qubit 104b. In these embodiments, because there is negligible direct exchange coupling between first superconducting qubit 104a and second superconducting qubit 104b, the static ZZ interactions between first superconducting qubit 104a and second superconducting qubit 104b is suppressed (e.g., cross-talk between first superconducting qubit 104a and second superconducting qubit 104b is suppressed). An advantage of these embodiments is that coupler device 602 can have a relatively higher internal quality factor compared to existing coplanar waveguide resonators, and thus, energy loss via coupler device 602 is less when compared to such existing coplanar waveguide resonators.

In the embodiments above, because first oscillating mode structure 616a corresponding to first oscillating mode 624a and second oscillating mode structure 616b corresponding to second oscillating mode 624b of coupler device 602 have strong (e.g., relatively strong) longitudinal coupling to each other, an effective four-body interaction can exist involving: first superconducting qubit 104a; second superconducting qubit 104b; first oscillating mode structure 616a corresponding to first oscillating mode 624a; and second oscillating mode structure 616b corresponding to second oscillating mode 624b. In these embodiments, such a four-body interaction allows an entangling gate between first superconducting qubit 104a and second superconducting qubit 104b by driving coupler device 602 (e.g., by applying microwave pulses to coupler device 602 using a pulse generator device and/or computer 1012 as described above) at a frequency detuned from either first oscillating mode 624a or second oscillating mode 624b (e.g., at 50 MHz or approximately 50 MHz), much like an RIP gate. In these embodiments, driving coupler device 602 at such a frequency detuned from either first oscillating mode 624a or second oscillating mode 624b generates a ZZ interaction, and thus entanglement, between first superconducting qubit 104a and second superconducting qubit 104b, but only in the presence of a microwave drive, thereby enabling controllable entanglement. In these embodiments, driving coupler device 602 at such a frequency detuned from either first oscillating mode 624a or second oscillating mode 624b can constitute detuning coupler device 602 from first oscillating mode 624a or second oscillating mode 624b.

The various embodiments of the subject disclosure described herein (e.g., device 100a, device 400a, device 600a, etc.) can be associated with various technologies. For example, the various embodiments of the subject disclosure described herein (e.g., device 100a, device 400a, device 600a, etc.) can be associated with quantum computing technologies, quantum gate technologies, quantum coupler technologies, quantum hardware and/or software technologies, quantum circuit technologies, superconducting circuit technologies, machine learning technologies, artificial intelligence technologies, cloud computing technologies, and/or other technologies.

The various embodiments of the subject disclosure described herein (e.g., device 100a, device 400a, device 600a, etc.) can provide technical improvements to systems, devices, components, operational steps, and/or processing steps associated with the various technologies identified above. For example, the various embodiments of the subject disclosure described herein (e.g., device 100a, device 400a, device 600a, etc.) can generate an exchange coupling of a first superconducting qubit and a second superconducting qubit with a first oscillating mode structure and a second oscillating mode structure of a coupler device; and/or produce an entangling quantum gate between the first superconducting qubit and the second superconducting qubit. In this example, such an exchange coupling can comprise an equal exchange coupling of first superconducting qubit 104a and second superconducting qubit 104b with first oscillating mode structure 116a corresponding to the first oscillating mode and second oscillating mode structure 116b corresponding to the second oscillating mode of coupler device 102. In this example, such an equal exchange coupling can yield a net suppression of ZZ interactions between first superconducting qubit 104a and second superconducting qubit 104b over a defined range of frequencies 202a corresponding to first superconducting qubit 104a and a defined range of frequencies 202b corresponding to second superconducting qubit 104b that are defined by region 202 as described above and illustrated in FIG. 2. In this example, such a net suppression of ZZ interactions between first superconducting qubit 104a and second superconducting qubit 104b can thereby facilitate at least one of: reduced quantum gate errors associated with first superconducting qubit 104a and/or second superconducting qubit 104b; increased speed of a quantum gate (e.g., an entangling quantum gate) comprising first superconducting qubit 104a and second superconducting qubit 104b; and/or improved fidelity, improved accuracy, and/or improved performance of a quantum processor comprising device 100a.

The various embodiments of the subject disclosure described herein (e.g., device 100a, device 400a, device 600a, etc.) can provide technical improvements to a processing unit (e.g., a quantum processor comprising device 100a, device 400a, or device 600a, processing unit 1014, etc.) associated with a classical computing device and/or a quantum computing device (e.g., a quantum processor, quantum hardware, superconducting circuit, etc.) that can be associated with one or more of the various embodiments of the subject disclosure described herein (e.g., device 100a, device 400a, device 600a, etc.). For example, by generating such an equal exchange coupling described above, the various embodiments of the subject disclosure described herein (e.g., device 100a, device 400a, device 600a, etc.) can suppress ZZ interactions between first superconducting qubit 104a and second superconducting qubit 104b and thereby facilitate: reduced quantum gate errors associated with first superconducting qubit 104a and/or second superconducting qubit 104b; and/or increased speed of a quantum gate (e.g., an entangling quantum gate) comprising first superconducting qubit 104a and second superconducting qubit 104b. In this example, by reducing such quantum gate errors and/or increasing the speed of such a quantum gate, one or more of the various embodiments of the subject disclosure described herein (e.g., device 100a, device 400a, device 600a, etc.) can facilitate improved fidelity, improved accuracy, and/or improved performance of a quantum processor comprising one or more of the various embodiments of the subject disclosure (e.g., a quantum processor comprising device 100a, device 400a, or device 600a and that executes the quantum gate).

Based on such suppression of ZZ interactions between first superconducting qubit 104a and second superconducting qubit 104b as described above, a practical application of the various embodiments of the subject disclosure described herein (e.g., device 100a, device 400a, device 600a, etc.) is that they can be implemented in a quantum device (e.g., a quantum processor, a quantum computer, etc.) to more quickly and more efficiently compute, with improved fidelity and/or accuracy, one or more solutions (e.g., heuristic(s), etc.) to a variety of problems ranging in complexity (e.g., an estimation problem, an optimization problem, etc.) in a variety of domains (e.g., finance, chemistry, medicine, etc.). For example, based on such suppression of ZZ interactions between first superconducting qubit 104a and second superconducting qubit 104b as described above, a practical application of one or more of the various embodiments of the subject disclosure described herein (e.g., device 100a, device 400a, device 600a, etc.) is that they can be implemented in, for instance, a quantum processor (e.g., a quantum processor comprising device 100a, device 400a, or device 600a) to compute, with improved fidelity and/or accuracy, one or more solutions (e.g., heuristic(s), etc.) to an optimization problem in the domain of chemistry, medicine, and/or finance, where such a solution can be used to engineer, for instance, a new chemical compound, a new medication, and/or a new options pricing system and/or method.

It should be appreciated that the various embodiments of the subject disclosure described herein (e.g., device 100a, device 400a, device 600a, etc.) provide a new approach driven by relatively new quantum computing technologies. For example, the various embodiments of the subject disclosure described herein (e.g., device 100a, device 400a, device 600a, etc.) provide a new approach to suppress ZZ interactions between first superconducting qubit 104a and second superconducting qubit 104b as described above that result in quantum gate errors during quantum computations. In this example, such a new approach to suppress ZZ interactions can enable faster and more efficient quantum computations with improved fidelity and/or accuracy using a quantum processor comprising one or more of the various embodiments of the subject disclosure described herein (e.g., device 100a, device 400a, device 600a, etc.).

The various embodiments of the subject disclosure described herein (e.g., device 100a, device 400a, device 600a, etc.) can employ hardware or software to solve problems that are highly technical in nature, that are not abstract and that cannot be performed as a set of mental acts by a human. In some embodiments, one or more of the processes described herein can be performed by one or more specialized computers (e.g., a specialized processing unit, a specialized classical computer, a specialized quantum computer, etc.) to execute defined tasks related to the various technologies identified above. The various embodiments of the subject disclosure described herein (e.g., device 100a, device 400a, device 600a, etc.) can be employed to solve new problems that arise through advancements in technologies mentioned above, employment of quantum computing systems, cloud computing systems, computer architecture, and/or another technology.

It is to be appreciated that the various embodiments of the subject disclosure described herein (e.g., device 100a, device 400a, device 600a, etc.) can utilize various combinations of electrical components, mechanical components, and circuitry that cannot be replicated in the mind of a human or performed by a human, as the various operations that can be executed by the various embodiments of the subject disclosure described herein (e.g., device 100a, device 400a, device 600a, etc.) are operations that are greater than the capability of a human mind. For instance, the amount of data processed, the speed of processing such data, or the types of data processed by the various embodiments of the subject disclosure described herein (e.g., device 100a, device 400a, device 600a, etc.) over a certain period of time can be greater, faster, or different than the amount, speed, or data type that can be processed by a human mind over the same period of time.

According to several embodiments, the various embodiments of the subject disclosure described herein (e.g., device 100a, device 400a, device 600a, etc.) can also be fully operational towards performing one or more other functions (e.g., fully powered on, fully executed, etc.) while also performing the various operations described herein. It should be appreciated that such simultaneous multi-operational execution is beyond the capability of a human mind. It should also be appreciated that the various embodiments of the subject disclosure described herein (e.g., device 100a, device 400a, device 600a, etc.) can include information that is impossible to obtain manually by an entity, such as a human user. For example, the type, amount, and/or variety of information included in device 100a, device 400a, and/or device 600a can be more complex than information obtained manually by a human user.

Figure 7:
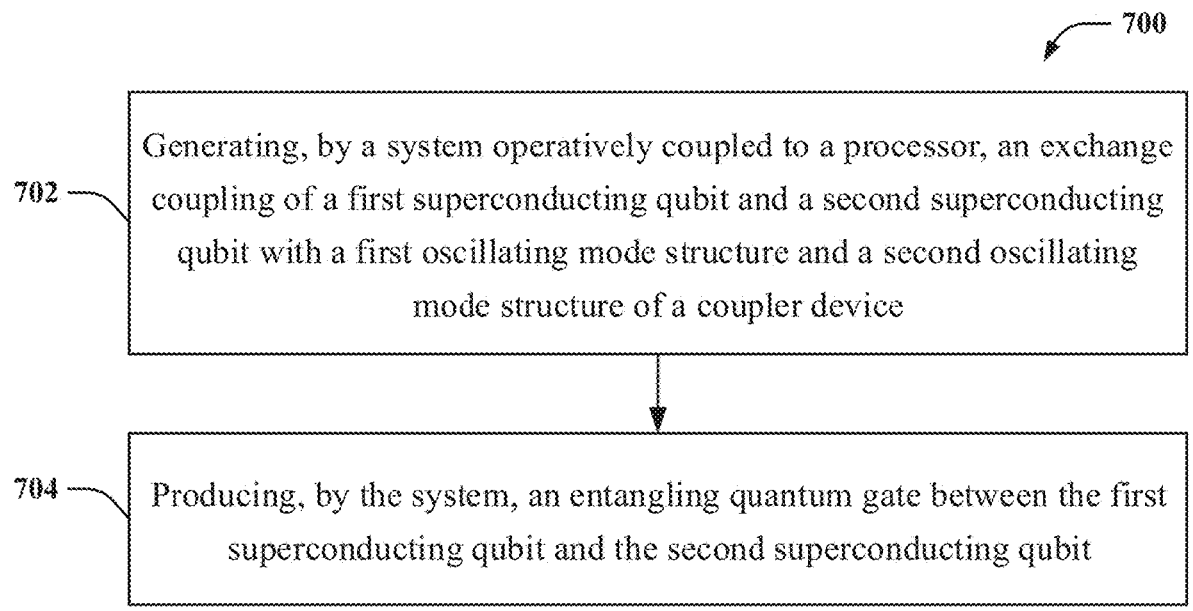
FIGS. 7, 8, and 9 illustrate flow diagrams of example, non-limiting computer-implemented methods that can facilitate ZZ cancellation between qubits in accordance with one or more embodiments described herein.

FIG. 7 illustrates a flow diagram of an example, non-limiting computer-implemented method 700 that can facilitate ZZ cancellation between qubits in accordance with one or more embodiments described herein. Repetitive description of like elements and/or processes employed in respective embodiments is omitted for sake of brevity.

At 702, computer-implemented method 700 can comprise generating, by a system (e.g., a system comprising computer 1012, one or more types of the external device defined herein, device 100a, and/or coupler device 102) operatively coupled to a processor (e.g., processing unit 1014, etc.), an exchange coupling (e.g., an equal exchange coupling) of a first superconducting qubit (e.g., first superconducting qubit 104a) and a second superconducting qubit (e.g., second superconducting qubit 104b) with a first oscillating mode structure (e.g., first oscillating mode structure 116a corresponding to the first oscillating mode) and a second oscillating mode structure (e.g., second oscillating mode structure 116b corresponding to the second oscillating mode) of a coupler device (e.g., coupler device 102). For example, as described above with reference to FIGS. 1A and 1B, first superconducting qubit 104a and second superconducting qubit 104b can each be capacitively coupled to both first oscillating mode structure 116a and second oscillating mode structure 116b where such mode structures respectively correspond to the first oscillating mode and the second oscillating mode of coupler device 102. In this example, as described above with reference to FIGS. 1A and 1B, such capacitive coupling of first superconducting qubit 104a and second superconducting qubit 104b with first oscillating mode structure 116a and second oscillating mode structure 116b can generate an equal exchange coupling of first superconducting qubit 104a and second superconducting qubit 104b with first oscillating mode structure 116a and second oscillating mode structure 116b. In this example, as described above with reference to FIGS. 1A and 1B, such an equal exchange coupling can yield a net suppression (e.g., reduction, cancellation, etc.) of ZZ interactions (e.g., static ZZ interactions) between first superconducting qubit 104a and second superconducting qubit 104b over a defined range of qubit frequencies (e.g., defined range of frequencies 202a corresponding to first superconducting qubit 104a and a defined range of frequencies 202b corresponding to second superconducting qubit 104b that are defined by region 202 as described above and illustrated in FIG. 2).

At 704, computer-implemented method 700 can comprise producing, by the system (e.g., a system comprising computer 1012, one or more types of the external device defined herein, device 100a, and/or coupler device 102), an entangling quantum gate between the first superconducting qubit and the second superconducting qubit. For instance, as described above with reference to FIGS. 1A and 1B, an entity implementing device 100a (e.g., a human, a computing device, a software application, an agent, a machine learning model, an artificial intelligence model, etc.) can detune coupler device 102 from first oscillating mode structure 116a or second oscillating mode structure 116b, and thus, from the first oscillating mode or the second oscillating mode, to entangle first superconducting qubit 104a and second superconducting qubit 104b (e.g., to produce an entanglement quantum gate between first superconducting qubit 104a and second superconducting qubit 104b). In these embodiments, such entanglement of first superconducting qubit 104a and second superconducting qubit 104b can enable a quantum gate operation to be performed between first superconducting qubit 104a and second superconducting qubit 104b. For example, in these embodiments, based on detuning coupler device 102 from first oscillating mode structure 116a or second oscillating mode structure 116b, and thus, from the first oscillating mode or the second oscillating mode, device 100a and/or coupler device 102 can operate as a resonator-induced phase (RIP) gate, which can generate ZZ interactions between a first qubit (e.g., first superconducting qubit 104a) and a second qubit (e.g., second superconducting qubit 104b) that are present when there is a microwave drive (e.g., a microwave signal) at coupler device 102 (e.g., when there is a microwave signal applied to coupler device 102).

Figure 8:
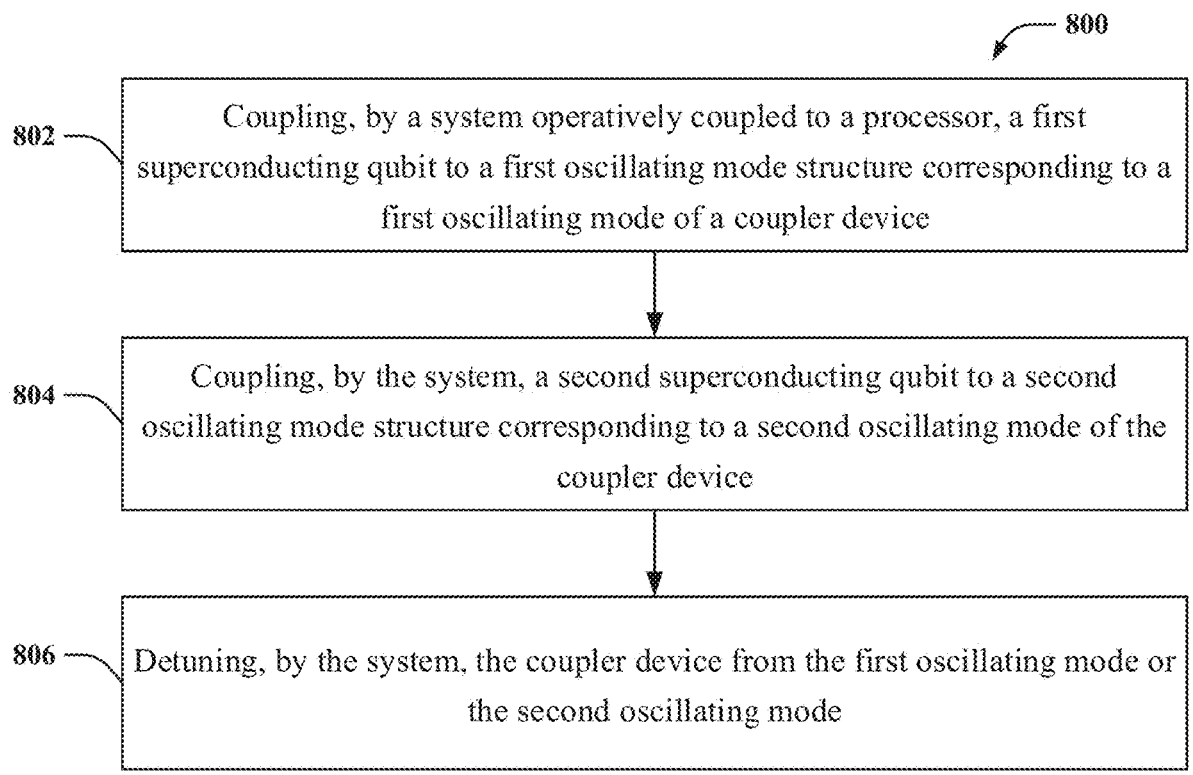

FIG. 8 illustrates a flow diagram of an example, non-limiting computer-implemented method 800 that can facilitate ZZ cancellation between qubits in accordance with one or more embodiments described herein. Repetitive description of like elements and/or processes employed in respective embodiments is omitted for sake of brevity.

At 802, computer-implemented method 800 can comprise coupling, by a system (e.g., a system comprising computer 1012, one or more types of the external device defined herein, device 600a, and/or coupler device 602) operatively coupled to a processor (e.g., processing unit 1014, etc.), a first superconducting qubit (e.g., first superconducting qubit 104a) to a first oscillating mode structure (e.g., second oscillating mode structure 616b, denoted as B mode in FIG. 6A) corresponding to a first oscillating mode (e.g., second oscillating mode 624b) of a coupler device (e.g., coupler device 602).

At 804, computer-implemented method 800 can comprise coupling, by the system (e.g., a system comprising computer 1012, one or more types of the external device defined herein, device 100a, and/or coupler device 102) operatively coupled to a processor (e.g., processing unit 1014, etc.), a second superconducting qubit (e.g., second superconducting qubit 104b) to a second oscillating mode structure (e.g., first oscillating mode structure 616a, denoted as A mode in FIG. 6A) corresponding to a second oscillating mode (e.g., first oscillating mode 624a) of the coupler device.

At 806, computer-implemented method 800 can comprise detuning, by the system (e.g., a system comprising computer 1012, one or more types of the external device defined herein, device 100a, and/or coupler device 102) operatively coupled to a processor (e.g., processing unit 1014, etc.), the coupler device from the first oscillating mode or the second oscillating mode. For example, with reference to the example embodiment described above and illustrated in FIGS. 6A and 6B, because first oscillating mode structure 616a corresponding to first oscillating mode 624a and second oscillating mode structure 616b corresponding to second oscillating mode 624b of coupler device 602 have strong (e.g., relatively strong) longitudinal coupling to each other, an effective four-body interaction can exist involving: first superconducting qubit 104a; second superconducting qubit 104b; first oscillating mode structure 616a corresponding to first oscillating mode 624a; and second oscillating mode structure 616b corresponding to second oscillating mode 624b. In these embodiments, such a four-body interaction allows an entangling gate between first superconducting qubit 104a and second superconducting qubit 104b by driving coupler device 602 (e.g., by applying microwave pulses to coupler device 602 using a pulse generator device and/or computer 1012 as described above) at a frequency detuned from either first oscillating mode 624a or second oscillating mode 624b (e.g., at 50 MHz or approximately 50 MHz), much like an RIP gate. In these embodiments, driving coupler device 602 at such a frequency detuned from either first oscillating mode 624a or second oscillating mode 624b generates a ZZ interaction, and thus entanglement, between first superconducting qubit 104a and second superconducting qubit 104b, but only in the presence of a microwave drive, thereby enabling controllable entanglement. In these embodiments, driving coupler device 602 at such a frequency detuned from either first oscillating mode 624a or second oscillating mode 624b can constitute detuning coupler device 602 from first oscillating mode 624a or second oscillating mode 624b.

Figure 9:
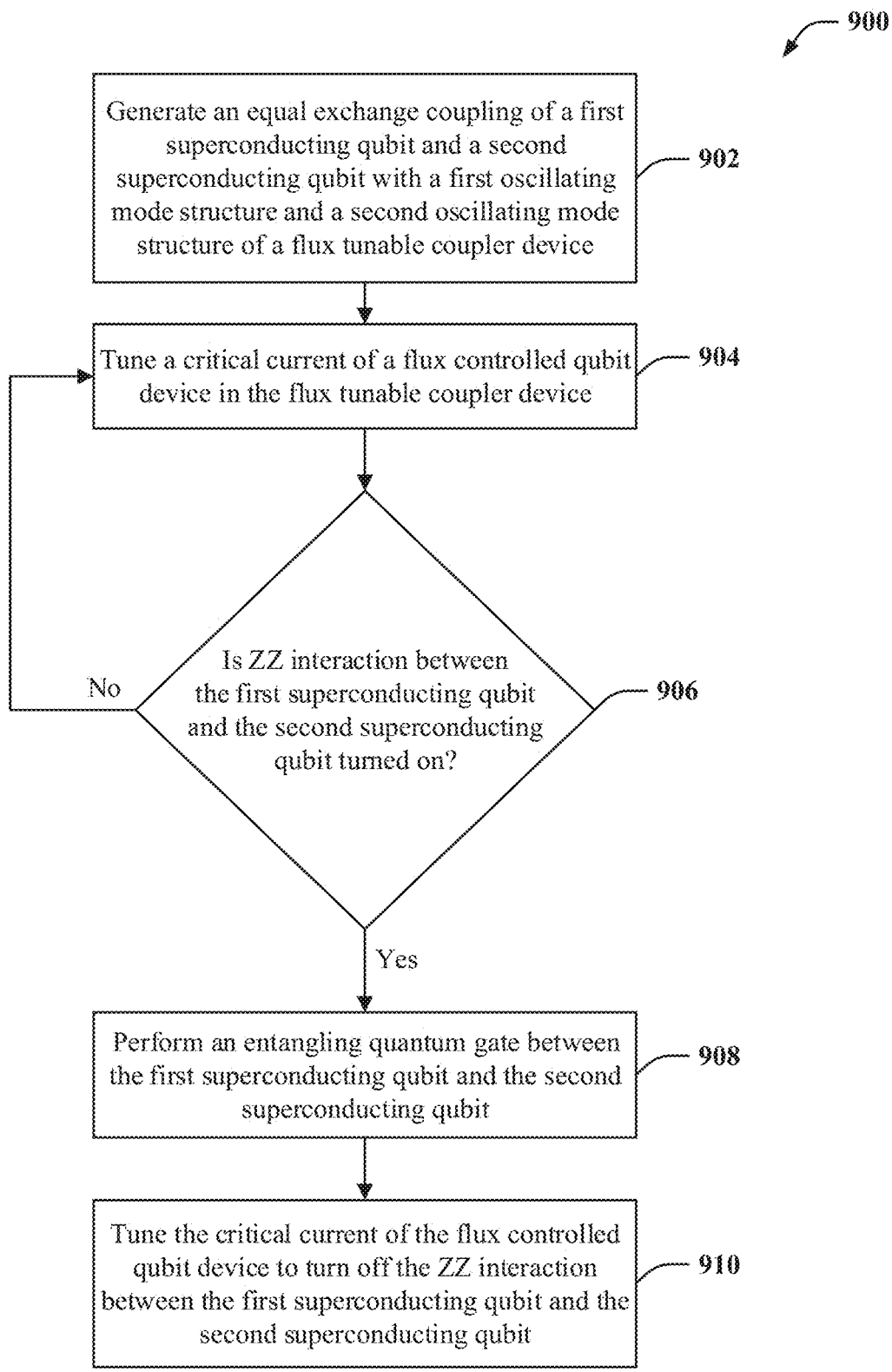

FIG. 9 illustrates a flow diagram of an example, non-limiting computer-implemented method 900 that can facilitate ZZ cancellation between qubits in accordance with one or more embodiments described herein. Repetitive description of like elements and/or processes employed in respective embodiments is omitted for sake of brevity.

At 902, computer-implemented method 900 can comprise generating (e.g., via a system comprising computer 1012, one or more types of the external device defined herein, device 400a, and/or coupler device 402) an equal exchange coupling of a first superconducting qubit (e.g., first superconducting qubit 104a) and a second superconducting qubit (e.g., second superconducting qubit 104b) with a first oscillating mode structure (e.g., first oscillating mode structure 116a corresponding to the first oscillating mode) and a second oscillating mode structure (e.g., second oscillating mode structure 116b corresponding to the second oscillating mode) of a flux tunable coupler device (e.g., coupler device 402).

At 904, computer-implemented method 900 can comprise tuning (e.g., via a system comprising computer 1012, one or more types of the external device defined herein, device 400a, and/or coupler device 402) a critical current of a flux controlled qubit device (e.g., flux controlled qubit device 404 comprising a SQUID loop) in the flux tunable coupler device. For example, as described above with reference to FIGS. 4A, 4B, and 5, an entity as defined herein can tune (e.g., adjust) a critical current of flux controlled qubit device 404 in coupler device 402 by using a magnetic field generator to apply an external magnetic field to coupler device 402 and/or flux controlled qubit device 404.

At 906, computer-implemented method 900 can comprise determining (e.g., via a system comprising computer 1012, one or more types of the external device defined herein, device 100a, and/or coupler device 102) whether the ZZ interaction between the first superconducting qubit and the second superconducting qubit is turned on. For example, as described above with reference to FIGS. 4A, 4B, and 5, an entity as defined herein can tune (e.g., adjust) a critical current of flux controlled qubit device 404 in coupler device 402 by using a magnetic field generator to apply an external magnetic field to coupler device 402 and/or flux controlled qubit device 404. In this example, such an entity can tune the critical current of flux controlled qubit device 404 to a current value (e.g., approximately 26.5 nA) corresponding to on position 502 defined on graph 500 depicted in FIG. 5, where on position 502 corresponds to relatively high ZZ interaction (e.g., ZZ interaction is effectively on) between first superconducting qubit 104a and second superconducting qubit 104b. Consequently, in this example, a determination as to whether the ZZ interaction is turned on can be performed using graph 500 to tune (e.g., adjust) the critical current of flux controlled qubit device 404 to such a current value corresponding to on position 502 defined on graph 500.

If it is determined at 906 that the ZZ interaction between the first superconducting qubit and the second superconducting qubit is turned on, at 908, computer-implemented method 900 can comprise performing (e.g., via a system comprising computer 1012, one or more types of the external device defined herein, device 400a, and/or coupler device 402) an entangling quantum gate between the first superconducting qubit and the second superconducting qubit. For example, tuning the critical current of flux controlled qubit device 404 to a current value corresponding to on position 502 defined on graph 500 (e.g., as described above) can cause first superconducting qubit 104a to entangle with second superconducting qubit 104b, thereby enabling an entangling quantum gate between first superconducting qubit 104a and second superconducting qubit 104b. In this example, such entanglement of first superconducting qubit 104a and second superconducting qubit 104b can enable a quantum gate operation (e.g., an entangling quantum gate operation) to be performed between first superconducting qubit 104a and second superconducting qubit 104b.

At 910, computer-implemented method 900 can comprise tuning (e.g., via a system comprising computer 1012, one or more types of the external device defined herein, device 400a, and/or coupler device 402) the critical current of the flux controlled qubit device to turn off the ZZ interaction between the first superconducting qubit and the second superconducting qubit.

For example, as described above with reference to FIGS. 4A, 4B, and 5, an entity as defined herein can tune (e.g., adjust) a critical current of flux controlled qubit device 404 in coupler device 402 by using a magnetic field generator to apply an external magnetic field to coupler device 402 and/or flux controlled qubit device 404. In this example, such an entity can tune the critical current of flux controlled qubit device 404 to a current value (e.g., approximately 39 nA) corresponding to off position 504 defined on graph 500 depicted in FIG. 5, where off position 504 corresponds to relatively low ZZ interaction (e.g., ZZ interaction is effectively off) between first superconducting qubit 104a and second superconducting qubit 104b. Consequently, in this example, a determination as to whether the ZZ interaction is turned off can be performed using graph 500 to tune (e.g., adjust) the critical current of flux controlled qubit device 404 to such a current value corresponding to off position 504 defined on graph 500.

If it is determined at 906 that the ZZ interaction between the first superconducting qubit and the second superconducting qubit is not turned on, computer-implemented method 900 can comprise returning to operation 904 to tune the critical current of the flux controlled qubit device in the flux tunable coupler device. In various embodiments, operations 904 and 906 of computer-implemented method 900 can be repeated until the ZZ interaction between the first superconducting qubit and the second superconducting qubit is turned on. In these embodiments, based on repeating operations 904 and 906 until the ZZ interaction between the first superconducting qubit and the second superconducting qubit is turned on, computer-implemented method 900 can proceed to operations 908 and 910.

Figure 10:
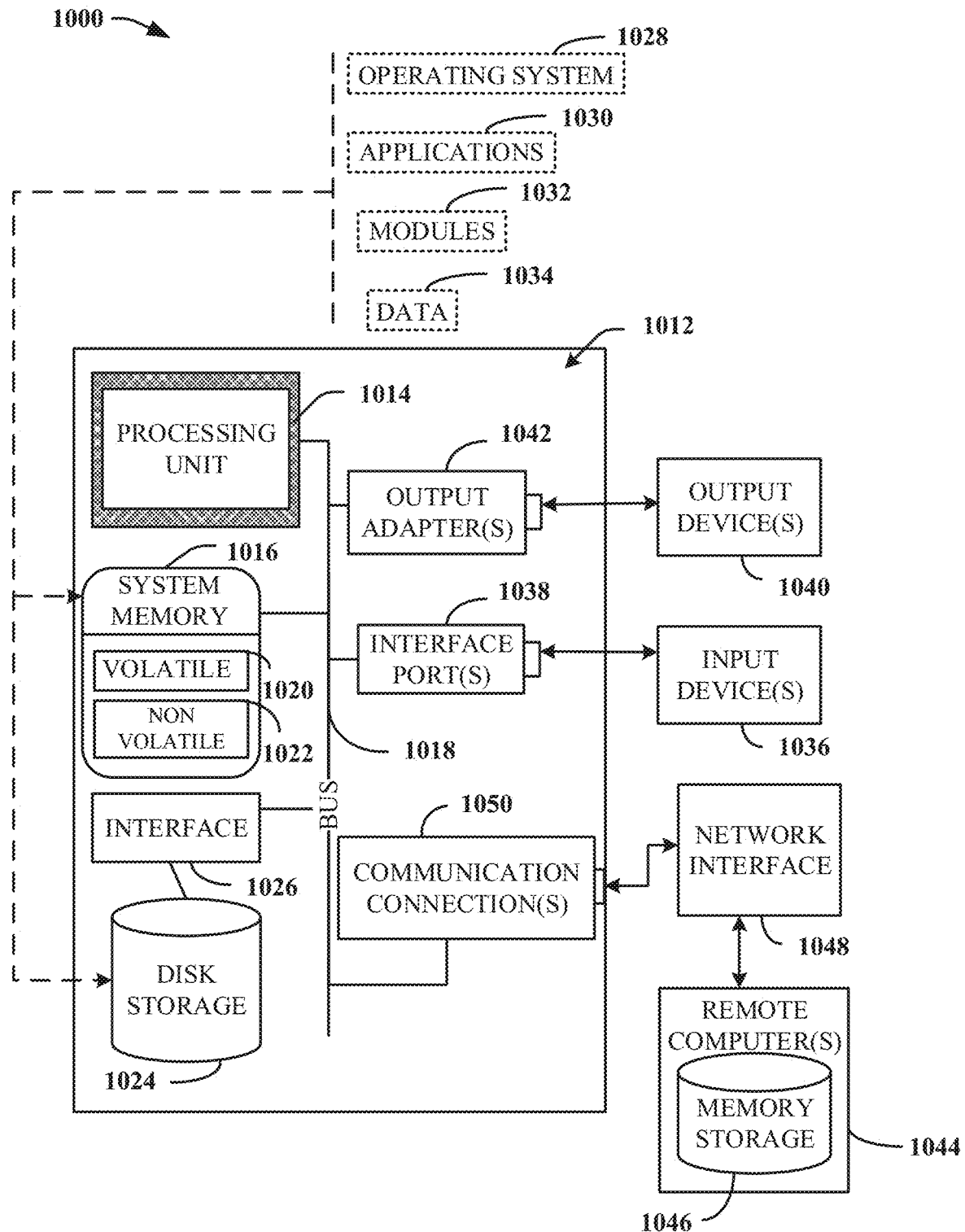
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. For example, as described below, operating environment 1000 can be used to implement the example, non-limiting multi-step fabrication sequences described above with reference to FIGS. 1A and 1B that can be implemented to fabricate device 100*a*, 400*a*, and/or 600*a* in accordance with one or more embodiments of the subject disclosure as described herein. In another example, as described below, operating environment 1000 can be used to implement one or more of the example, non-limiting computer-implemented methods 700, 800, and/or 900 described above with reference to FIGS. 7, 8, and 9, respectively. Repetitive description of like elements and/or processes employed in other embodiments described herein is omitted for sake of brevity.

The example, non-limiting multi-step fabrication sequences described above with reference to FIGS. 1A and 1B, which can be implemented to fabricate device 100*a*, 400*a*, and/or 600*a*, can be implemented by a computing system (e.g., operating environment 1000 illustrated in FIG. 10 and described below) and/or a computing device (e.g., computer 1012 illustrated in FIG. 10 and described below). In non-limiting example embodiments, such computing system (e.g., operating environment 1000) and/or such computing device (e.g., computer 1012) can comprise one or more processors and one or more memory devices that can store executable instructions thereon that, when executed by the one or more processors, can facilitate performance of the example, non-limiting multi-step fabrication sequences described above with reference to FIGS. 1A and 1B. As a non-limiting example, the one or more processors can facilitate performance of the example, non-limiting multi-step fabrication sequences described above with reference to FIGS. 1A and 1B by directing and/or controlling one or more systems and/or equipment operable to perform semiconductor and/or superconductor device fabrication.

In another example, one or more of the example, non-limiting computer-implemented methods 700, 800, and/or 900 described above with reference to FIGS. 7, 8, and 9, respectively, can also be implemented (e.g., executed) by operating environment 1000. As a non-limiting example, the one or more processors of such a computing device (e.g., computer 1012) can facilitate performance of one or more of the example, non-limiting computer implemented methods 700, 800, and/or 900 described above with reference to FIGS. 7, 8, and 9, respectively, by directing and/or controlling one or more systems and/or equipment (e.g., one or more types of the external device defined herein, etc.) operable to perform the operations and/or routines of such computer-implemented method(s).

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
   generating, by a system operatively coupled to a processor, an exchange coupling of a first superconducting qubit and a second superconducting qubit with a first oscillating mode structure and a second oscillating mode structure of a coupler device; and
   producing, by the system, an entangling quantum gate between the first superconducting qubit and the second superconducting qubit.

2. The computer-implemented method of claim 1, wherein at least one of the first superconducting qubit or the second superconducting qubit comprises at least one of a transmon qubit, a fixed frequency qubit, or a fixed frequency transmon qubit.

3. The computer-implemented method of claim 1, wherein the coupler device comprises at least one of a two junction qubit, a fixed frequency coupler, a multimode two junction coupler, a flux tunable coupler, a tunable coupler qubit, a flux tunable coupler qubit, a tunable qubit, a tunable bus, or a flux tunable qubit bus.

4. The computer-implemented method of claim 1, wherein the first oscillating mode structure and the second oscillating mode structure respectively correspond to a first oscillating mode and a second oscillating mode of the coupler device, and wherein the first oscillating mode and the second oscillating mode are indicative of symmetric and antisymmetric combinations of excitations associated with a first Josephson Junction and a second Josephson Junction of the coupler device.

5. The computer-implemented method of claim 1, further comprising:
   generating, by the system, an equal exchange coupling of the first superconducting qubit and the second superconducting qubit with the first oscillating mode structure and the second oscillating mode structure to suppress ZZ interactions between the first superconducting qubit and the second superconducting qubit over a defined range of qubit frequencies, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the coupler device, the first superconducting qubit, and the second superconducting qubit.

6. A computer-implemented method, comprising:
coupling, by a system operatively coupled to a processor, a first superconducting qubit to a first oscillating mode structure corresponding to a first oscillating mode of a coupler device;
coupling, by the system, a second superconducting qubit to a second oscillating mode structure corresponding to a second oscillating mode of the coupler device; and
detuning, by the system, the coupler device from the first oscillating mode or the second oscillating mode.

7. The computer-implemented method of claim 6, wherein at least one of the first superconducting qubit or the second superconducting qubit comprises at least one of a transmon qubit, a fixed frequency qubit, or a fixed frequency transmon qubit.

8. The computer-implemented method of claim 6, wherein the coupler device comprises at least one of a two junction qubit, a fixed frequency coupler, a multimode two junction coupler, a flux tunable coupler, a tunable coupler qubit, a flux tunable coupler qubit, a tunable qubit, a tunable bus, or a flux tunable qubit bus.

9. The computer-implemented method of claim 6, wherein the first oscillating mode and the second oscillating mode are indicative of symmetric and antisymmetric combinations of excitations associated with a first Josephson Junction and a second Josephson Junction of the coupler device.

10. The computer-implemented method of claim 6, further comprising:
coupling, by the system, the first superconducting qubit to the first oscillating mode structure and the second superconducting qubit to the second oscillating mode structure to reduce a direct exchange coupling between the first superconducting qubit and the second superconducting qubit and to suppress ZZ interactions between the first superconducting qubit and the second superconducting qubit, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the coupler device, the first superconducting qubit, and the second superconducting qubit.

* * * * *